United States Patent [19]
Hasegawa et al.

[11] Patent Number: 6,144,719
[45] Date of Patent: *Nov. 7, 2000

[54] EXPOSURE METHOD, EXPOSURE DEVICE AND DEVICE PRODUCING METHOD

[75] Inventors: Takayuki Hasegawa; Yutaka Tanaka, both of Utsunomiya, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/786,217

[22] Filed: Jan. 21, 1997

[30] Foreign Application Priority Data

| Jan. 22, 1996 | [JP] | Japan | 8-026263 |
| Feb. 9, 1996 | [JP] | Japan | 8-046875 |
| Mar. 7, 1996 | [JP] | Japan | 8-079623 |

[51] Int. Cl.[7] .................................................. H01L 21/30
[52] U.S. Cl. ............................................. 378/34; 378/35
[58] Field of Search .................................. 378/34, 35, 205, 378/206, 207

[56] References Cited

U.S. PATENT DOCUMENTS

| 4,385,434 | 5/1983 | Zehnpfennig et al. | 378/34 X |
| 4,475,223 | 10/1984 | Taniguchi et al. | 378/34 |
| 5,333,167 | 7/1994 | Iizuka et al. | 378/34 X |
| 5,604,779 | 2/1997 | Amemiya et al. | 378/34 |

*Primary Examiner*—David P. Porta
*Attorney, Agent, or Firm*—Fitzpatrick, Cella, Harper & Scinto

[57] ABSTRACT

An exposure method including the steps of providing a wafer and a mask having a membrane and a pattern formed thereon, arranging the mask and the wafer opposite to each other, obtaining information corresponding to deformation of the membrane of the mask, reducing the influence of the deformation of the membrane, and transferring the pattern of the mask to the wafer by exposing the mask to radiant energy. Also disclosed is an exposure device for performing this exposure method.

88 Claims, 24 Drawing Sheets

EXPOSURE METHOD, EXPOSURE DEVICE AND DEVICE PRODUCING METHOD

BACKGROUND OF THE INVENTION

1. Field of the Invention

The present invention relates to an exposure method, an exposure device and a device producing method which are suitable, in particular, for proximity-type exposure systems for semiconductor device manufacture, in which exposure is effected while the mask and the wafer are kept so close to each other as to leave a minute gap between them.

2. Description of the Related Art

To cope with the present-day further miniaturization of semiconductor devices, exposure devices using a short-wavelength exposure beam, such as X-rays, are being developed. In such exposure devices, a so-called proximity exposure system is generally adopted, in which exposure is effected with the mask and the wafer being kept so close to each other as to leave a minute gap, for example, on the order of several tens of $\mu$m between them.

FIG. 25 is a schematic diagram showing an exposure device using X-rays such as synchrotron orbital radiation. The exposure device includes a wafer stage 110 and a mask stage 120. The wafer stage 110 includes a guide device 112 fixed to a wafer stage base 111, a rough movement stage 113 guided in the direction of two axes (the X-axis and the Y-axis) orthogonal to the optical axis (the Z-axis) of the X-rays, and a fine movement stage 114 supported by the rough movement stage 113. The fine movement stage 114 supports a wafer chuck 115 for chucking a wafer Wo and is capable of moving, for example, in six-axis directions (X, Y, and Z-axis directions and $\omega$X, $\omega$Y, and $\omega$Z-axis directions) by a minute amount on the rough movement stage 113. The fine movement stage 114 is moved in the X- and Y-axis directions to thereby effect final alignment of the mask Mo with respect to the wafer Wo. At the same time, an exposure gap setting movement is effected, in which the fine movement stage 114 is moved in the Z-axis direction to bring the wafer Wo and the mask Mo close to each other so as to leave a predetermined minute gap (exposure gap) between them. The mask Mo has a membrane Eo equipped with a pattern (not shown) and a mask frame Ho supporting it. The thickness of the membrane Eo is approximately 2 $\mu$m, and the mask frame Ho is chucked by a mask chuck 122 supported by a mask stage base 121 to thereby align the mask Mo with respect to the optical path of the X-rays. Further, the wafer stage base 111 and the mask stage base 121 are fixed to the inner wall of an exposure chamber 101 maintained in a reduced pressure atmosphere of helium gas or the like. In a side wall of the exposure chamber 101, a window opening on a high-vacuum beam duct 102 is provided, in which window there is provided a thin film 103 of beryllium or the like serving as an interception between the atmosphere of the exposure chamber 101 and that of the beam duct 102.

In the proximity exposure system, a so-called step-and-repeat method is generally adopted, according to which a plurality of angles of view of the wafer Wo are sequentially moved stepwise relative to the application area of the X-rays, i.e., a position opposite to the mask Mo, to thereby effect exposure. The exposure gap between the mask Mo and the wafer Wo at the time of exposure is set at approximately 10 to 50 $\mu$m. The exposure cycle by the step-and-repeat method is conducted as follows:

When the exposure gap between the wafer Wo and the mask Mo is set, as described above, to be approximately 10 to 50 $\mu$m, there is a concern that the wafer will interfere with the mask Mo during the step movement of the wafer Wo, so that the wafer Wo is retracted in the Z-axis direction to a predetermined retracted position (for example, to a position where the distance (gap) between the wafer and the mask Mo is approximately 100 $\mu$m), and then, the rough movement stage 113 is driven and the wafer Wo is moved stepwise to move the next exposure angle of view to a position opposite to the mask Mo. Then, the fine movement stage 114 is driven in the Z-axis direction to bring the wafer Wo and the mask Mo close to each other to set the exposure gap as described above, and the fine movement stage 114 is driven in the X and Y-axis directions to effect final alignment between the wafer Wo and the mask Mo. After this, X-rays are applied to project the pattern of the mask Mo onto the wafer Wo, to transfer and print the mask pattern onto the wafer. After the transfer and printing have been completed, the fine movement stage 114 is reversely moved in the Z-axis direction to retract the wafer Wo to the retracted position. Then, as described above, the rough movement stage 113 is driven to perform step movement by means of which the next exposure angle of view of the wafer Wo is brought to the position opposite to the mask Mo, and, in the same manner as described above, the processes of setting the exposure gap, final alignment, and transfer and printing are repeated.

However, in the above-described conventional technique, the thickness of the membrane of the mask is as thin as approximately 2 $\mu$m, which indicates a very low level of rigidity. Thus, when the fine movement stage is driven in the Z-axis direction to set the exposure gap between the mask and the wafer, the membrane may flap to become bent (deformed), with the result that distortion, misalignment, etc., are generated in the pattern of the mask. When exposure is started before such deformation of the membrane has subsided to a sufficient degree, a deterioration in transfer accuracy is generated, so that a long stand-by period is necessary before starting exposure, resulting in a reduction in throughput. Further, such bending of the membrane also occurs when the wafer is retracted to the retracted position after the completion of the exposure. When the amount of deformation is large, various problems are entailed. For example, the membrane and the wafer are brought into contact with each other, or the membrane suffers damage.

SUMMARY OF THE INVENTION

The present invention has been made with a view toward solving the above problem in the prior art, that is, the deformation of the mask membrane.

It is a principal object of the present invention to provide an exposure method, an exposure apparatus, a device producing method, etc., which make it possible to effect pattern transfer with high accuracy even when the mask membrane is deformed.

To achieve this object, there is provided, in accordance with the present invention, an exposure method comprising the steps of: providing a wafer and a mask having a membrane and a pattern formed thereon; arranging the mask and the wafer opposite to each other; obtaining information corresponding to deformation of the membrane of the mask; reducing the influence of the deformation of the membrane; and transferring the pattern of the mask onto the wafer by exposing the mask to radiant energy.

The device producing method of the present invention is characterized in that devices, such as semiconductor devices, are produced by utilizing this exposure method.

In accordance with the present invention, there is further provided an exposure apparatus comprising: a mask stage for holding a mask having a membrane and a pattern formed thereon; a wafer stage for holding a wafer; means for obtaining information corresponding to deformation of the membrane of the mask; means for reducing the influence of the deformation of the membrane; and exposure means for transferring the pattern of the mask onto the wafer by exposing the mask to radiant energy.

Further objects and features of the present invention will become apparent from the following description of the preferred embodiments.

BRIEF DESCRIPTION OF THE DRAWINGS

FIGS. 5(a) and 5(b) show an exposure device according to another embodiment of the present invention, of which FIG. 5(a) is a schematic partial sectional view showing the essential portion thereof, and FIG. 5(b) is a diagram illustrating a measurement method;

DESCRIPTION OF THE PREFERRED EMBODIMENTS

Figure 1:
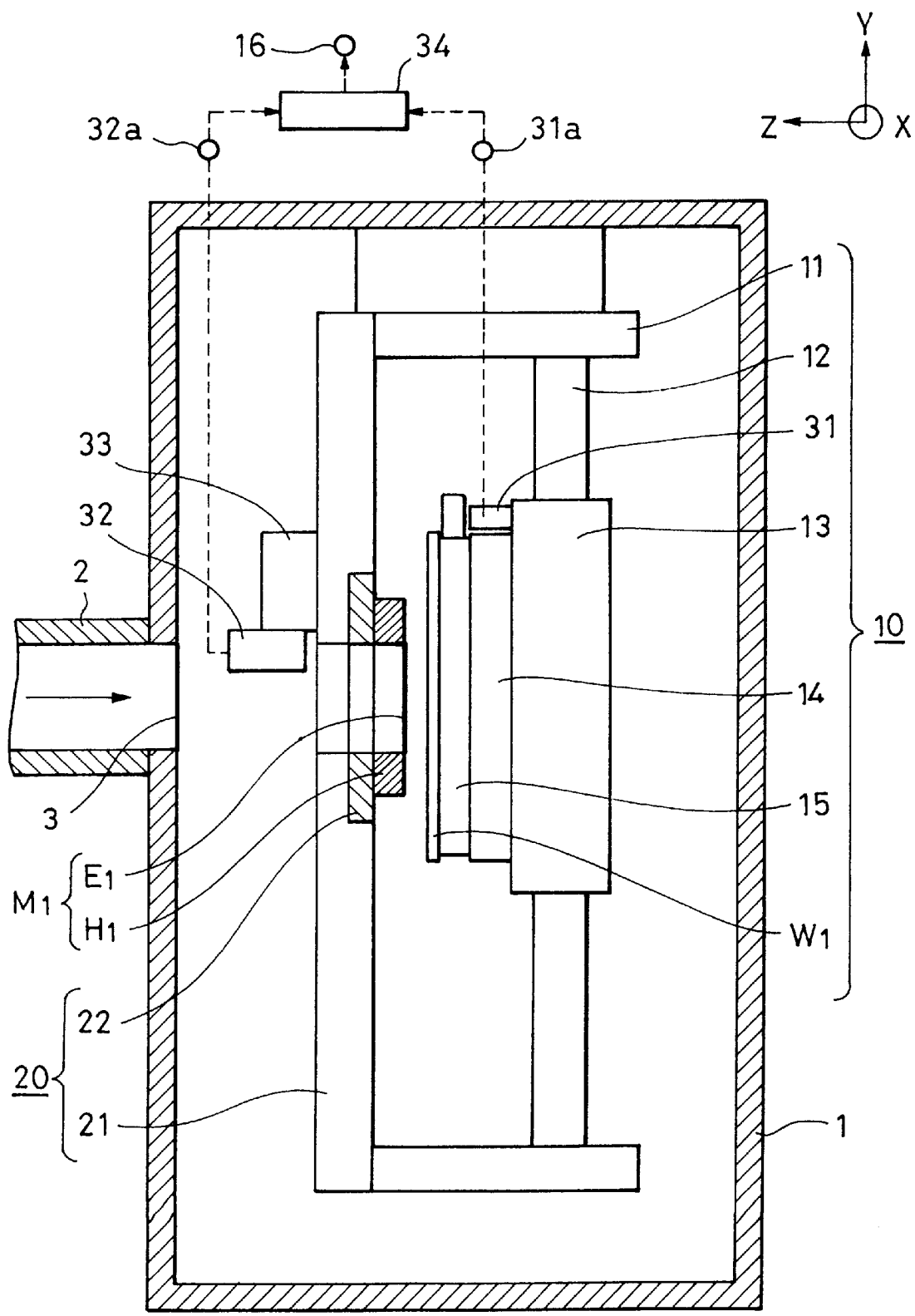
FIG. 1 is a diagram showing the essential portion of an exposure device according to an embodiment of the present invention.

FIG. 1 is a diagram showing the essential portion of an exposure device according to an embodiment of the present invention. The diagram shows a wafer stage 10, which is a positioning stage device for an exposure device that uses X-rays, such as synchrotron radiation, and a mask stage 20, which serves as an original holding means. The wafer stage 10 includes a guide device 12 fixed to a wafer stage base 11, a rough movement stage 13 serving as a first driving means, which is guided by the guide device in two-axis (X-axis and Y-axis) directions orthogonal to the optical axis (Z-axis) of the X-rays, and a fine movement stage 14 serving as a second driving means supported by the rough movement stage. The fine movement stage 14 supports a wafer chuck 15 chucking a wafer W1 serving as a substrate, and is movable on the rough movement stage 13 in, for example, six-axis directions (X, Y and Z-axis directions and $\omega X$, $\omega Y$ and $\omega Z$ directions) by minute amounts. By driving the fine movement stage 14 in the X-axis direction and the Y-axis direction, the final alignment of the wafer W1 with respect to the mask M1, which is the original, is effected. Further, the fine movement stage 14 is driven in the Z-axis direction to perform an exposure gap setting operation to bring the wafer W1 and the mask M1 so close to each other as to leave a minute gap (exposure gap) between them.

The mask M1 has a membrane E1 which is equipped with a pattern (not shown), and a mask frame Hi supporting it. The thickness of the membrane E1 is approximately 2 $\mu$m. The mask frame Hi is chucked by a mask chuck 22 supported by a mask stage base 21, whereby the mask M1 is aligned with respect to the optical path of the X-rays.

Further, the wafer stage base 11 and the mask stage base 21 are fixed to the inner wall of an exposure chamber, which maintains a reduced pressure atmosphere of helium gas or the like. In a side wall of the exposure chamber 1, a window opening on a high-vacuum beam duct 2 is provided, in which window there is provided a thin film 3 of beryllium or the like serving as an interception between the atmosphere of the exposure chamber 1 and that of the beam duct 2.

As described above, the rough movement stage 13 sequentially effects step movement for a plurality of exposure angles of view of the wafer W1 relative to the application area of the X-rays (the position opposite to the mask M1). On the rough movement stage 13, there is provided a Z-sensor 31, which is a substrate position measuring means for detecting the position of the wafer W1 in the Z-axis direction, which is the driving direction thereof, during the exposure gap setting operation by the fine movement stage 14 after the step movement of the wafer W1. By this Z-sensor, the position of the wafer W1 in the Z-axis direction (hereinafter, referred to as the "Z-position") is monitored.

Further, on the mask stage base 21, there are mounted well-known alignment scopes 32, which serve as a separation distance measuring means constituting the deformation amount measuring means together with the Z-sensor 31. The alignment scopes 32 are used to effect the final alignment of each exposure angle of view of the wafer W1 and the mask M1 after the step movement by using alignment marks provided on the mask M1 and the wafer W1. At the same time, the alignment scopes measure the distance (gap) between the membrane E1 of the mask M1 and the wafer W1. Usually, three alignment scopes 32 are arranged on the mask stage base 21 to perform measurement at three measurement points separated from each other along the surface of the membrane E1. Further, the alignment scopes 32 are supported by the two-axis stage 33 so that the alignment marks on the mask M1 can be measured even when their arrangement is changed, and are movable in the X- and Y-axis directions.

Figure 2:
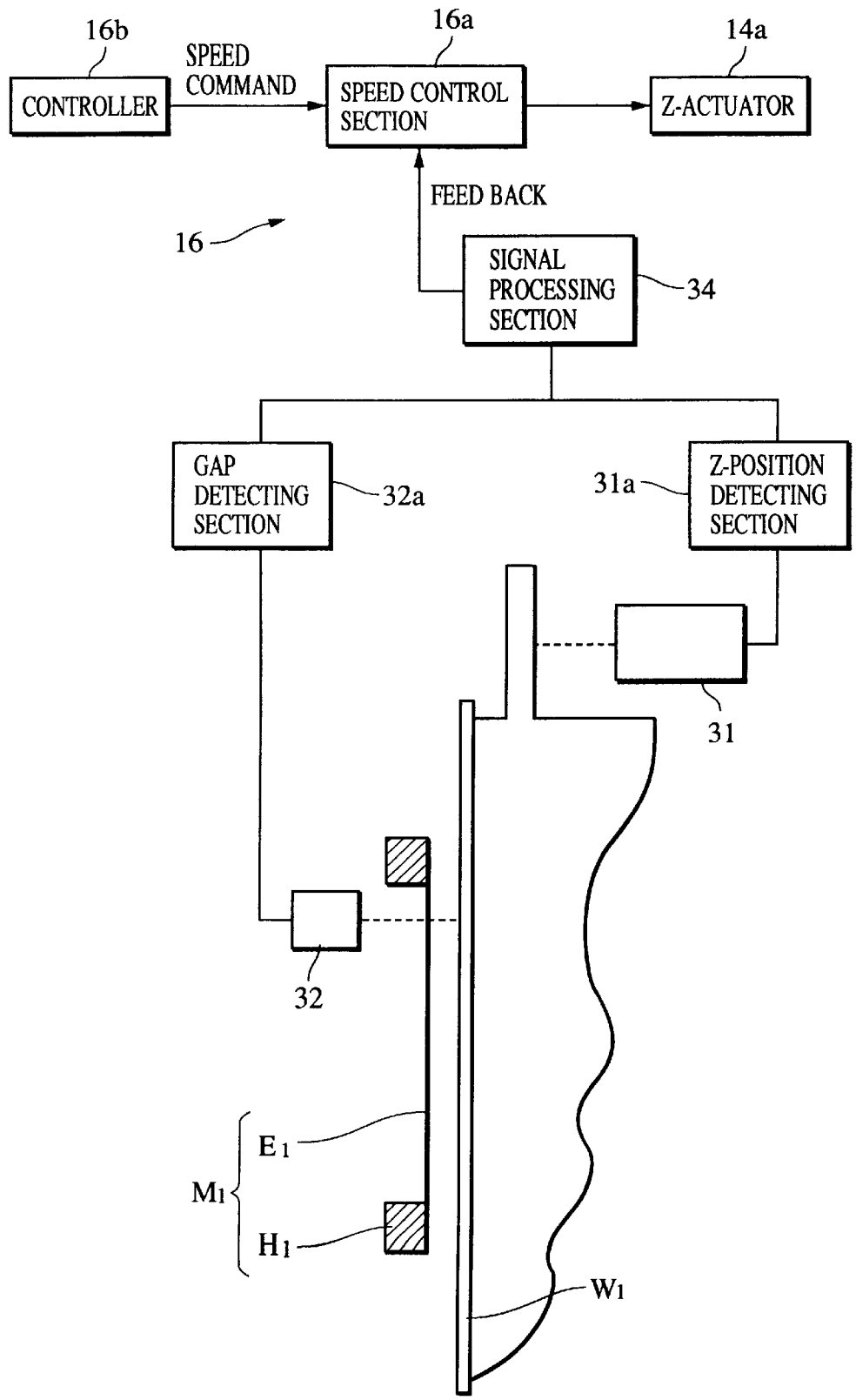
FIG. 2 is a diagram illustrating a measurement section and a control unit of the device shown in FIG. 1.

As shown in FIG. 2, the Z-position of the wafer chuck 15, that is, the wafer W1, and the change in gap between the wafer W1 and the membrane E1 measured by one of the three alignment scopes 32 are introduced to a signal processing section 34 by way of a Z-position detecting section 31a and a gap detecting section 32a, respectively. In this signal processing section 34, a bending amount, which is the deformation amount of the membrane E1, is calculated from the output of the Z-position detecting section 31a and that of the gap detecting section 32a, and introduced to a control unit 16 of the fine movement stage 14.

The control unit 16 has a speed control section 16a which is a speed control means for controlling the driving speed of the Z-actuator 14a for advancing and retracting the fine movement stage in the Z-axis direction, and a controller 16b, which generates a speed command signal in accordance with a preset program. The bending amount of the membrane E1 calculated in the signal processing section 34 is fed back to the speed control section 16 together with the output of the Z-position detecting section 31a, and the driving speed of the Z-actuator 14a of the fine movement stage 14 is reduced in accordance with both the bending amount of the membrane E1 and the Z-position of the wafer W1. In this way, the speed at which the wafer W1 is advanced or retracted in the Z-axis direction is reduced in accordance with the bending amount of the membrane E1, whereby the bending amount of the membrane E1 is controlled so as not to exceed the permissible value. While the distance between the wafer W1 and the mask M1 is large, the time needed for the subsiding of the bending is short, so that the speed reduction amount of the Z-actuator 14a is reduced, whereby the requisite time for the positioning of the wafer W1 between exposure cycles is prevented from becoming long. When the distance between the wafer W1 and the mask M1 is close to the exposure gap, a substantial speed reduction is effected for the Z-actuator 14a. In this way, various problems can be positively avoided. For example, the bending amount of the membrane E1 would not exceed the permissible value to cause breakage, nor would it come into contact with wafer W1. Further, the pattern of the mask M1 would not be markedly deformed to damage the accuracy in transfer and printing. Further, the stand-by time needed for the bent membrane E1 to be restored to the original form is reduced, thereby preventing a reduction in throughput.

After the exposure gap of the wafer W1 is set, the fine movement stage 14 is driven in the X- and Y-axis directions to effect the final alignment of the wafer W1 and the mask M1, and the pattern of the mask M1 is projected onto the wafer W1 to effect transfer and printing by X-rays introduced from a light source (not shown), serving as the exposure means, into the exposure chamber 1 by way of the beam duct 2. After the completion of the exposure, the Z-actuator 14a of the fine movement stage 14 is reversely driven to retract the wafer W1 to the retracted position, and the step movement for the next exposure cycle is started.

In the process of retracting the wafer W1 to the retracted position, also, the Z-position of the wafer W1 and the change in gap between the wafer W1 and the membrane E1 are calculated by using the Z-sensor 31 and the alignment scope 32, respectively, and the driving speed of the Z-actuator 14a of the fine movement stage 14 is controlled such that the bending amount of the membrane E1 does not exceed the permissible value.

The permissible value of the bending amount of the membrane M1 in the exposure gap setting operation for bringing the wafer W1 close to the mask M1 and the permissible value in the process for retracting the wafer W1 from the mask M1 to the retracted position are not necessarily the same. By setting the permissible value of the exposure gap setting process relatively low, the pattern of the mask M1 at the time of exposure gap setting is prevented from being markedly deformed, and the deformation of the pattern is quickly subsided to shorten the stand-by time before the exposure. On the other hand, in the retraction process after the completion of the exposure, the membrane E1 has only to be restored to its original form during the step movement of the next exposure cycle even when the bending amount of the membrane E1 is large, so that it is desirable that the above-mentioned permissible value be set large to thereby increase the alignment speed of the wafer W1 as much as possible, thereby achieving an improvement in terms of throughput.

Next, the method of obtaining the bending amount of the membrane E1 on the basis of the output of the gap detecting section 32a, i.e., the change in gap between the membrane E1 and the wafer W1 detected by one of the three alignment scopes 32, and the output of the Z-position detecting section 31a, i.e., the Z-position of the wafer W1 detected by the Z-sensor 31, will be described.

Figure 3:
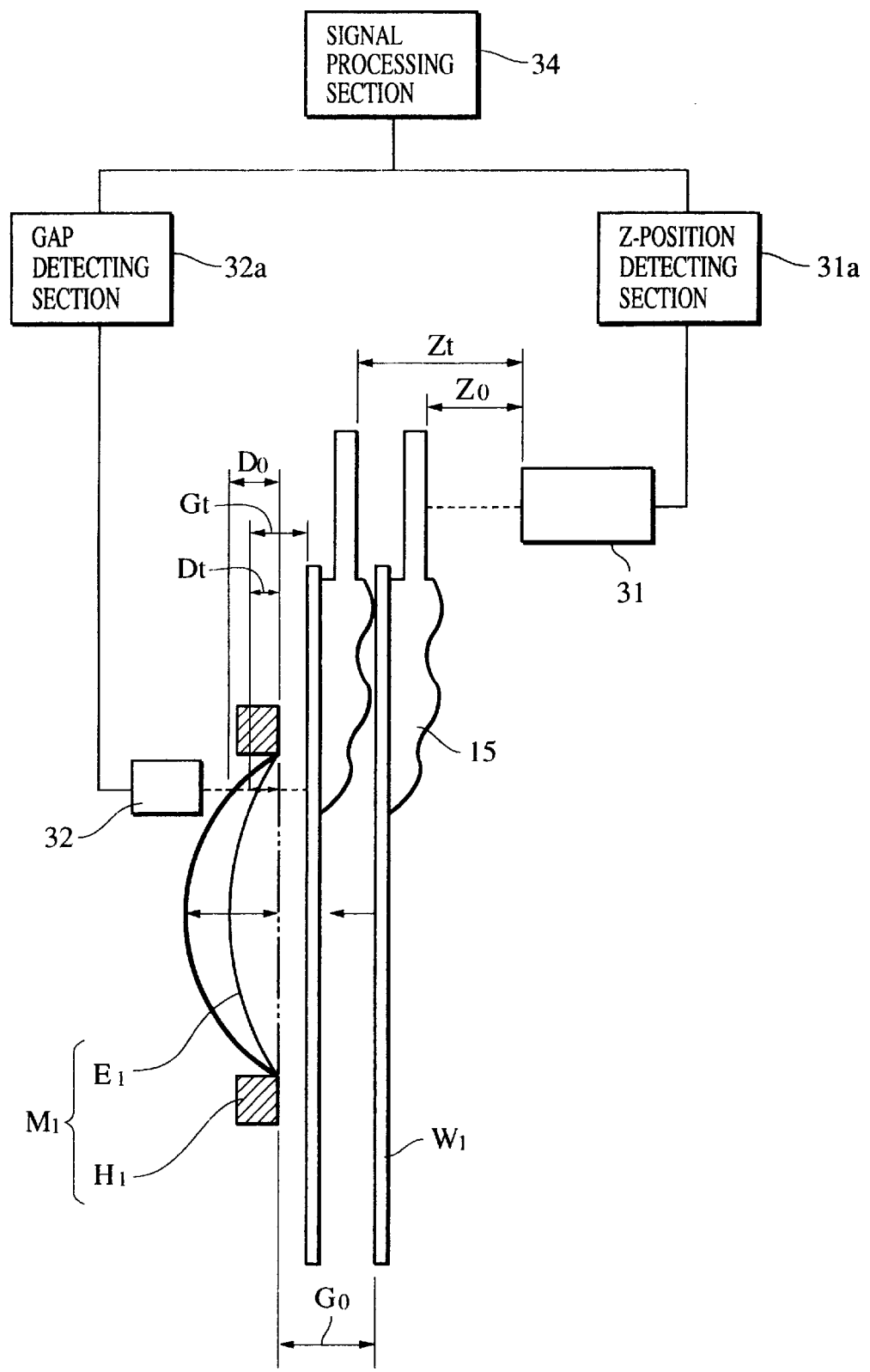
FIG. 3 is a diagram illustrating a measurement method using the device of FIG. 1.

As shown in FIG. 3, first, suppose that the output of the Z-position detecting section 31a and the output of the gap detecting section 32a prior to the driving of the Z-actuator 14a of the fine movement stage 14 are the initial value Z0 of the Z position of the wafer W1 and the initial value G0 of the distance (gap) between the membrane E1 of the mask M1, respectively. The Z-position Zt of the wafer W1 and the gap measurement value Gt after time t (msec) has elapsed since the start of the driving of the Z-actuator 14a of the fine movement stage 14 are detected, and the Z driving amount ΔZ and the change in gap ΔG are calculated as follows:

$$\Delta Z = |Zt - Z0|$$

$$\Delta G = |Gt - G0|.$$

Then, the bending amount Dt of the membrane E1 is calculated by the following equation:

$$Dt = |\Delta Z - \Delta G|$$

Further, the permissible value D0 of the bending amount Dt of the membrane E1 is set as follows: The bending of the membrane E1 is attributable to the change in pressure of the atmosphere between the wafer and the membrane when the wafer W1 is brought closer to the membrane E1 of the mask M1 or it is moved away therefrom. The bending amount of the membrane E1 due to such a change in pressure is largest in the central portion of the membrane E1. In view of this, the permissible value D1 of the bending amount of the central portion of the membrane E1 is set on the basis of the dimension of the exposure gap, the measurement accuracy of the alignment scope 32, the control error of the fine movement stage 14, the permissible amount of deformation of the pattern of the mask M1, etc., and the bending amount of the membrane E1 at the measurement position of the alignment scope 32 when the central portion of the membrane E1 has reached its permissible value D1 is obtained as the permissible value D0.

Alternatively, the relations hip between the bending amount of the central portion of the membrane E1 and the bending amount of the membrane E1 at the measurement position of the scope 32 is previously examined by experiment to obtain a relation representing the relationship. This experiment may be conducted by producing an experimental device similar to the exposure chamber of this embodiment, or the above relation can be indirectly obtained from an experiment conducted in the air.

Figure 4A:
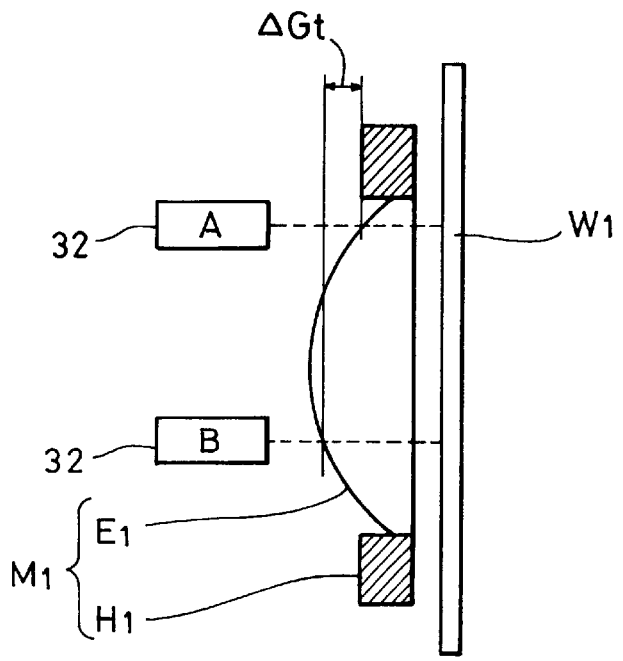
FIGS. 4(a) through 4(c) are diagrams illustrating a measurement method according to a modification.
Figure 4B:
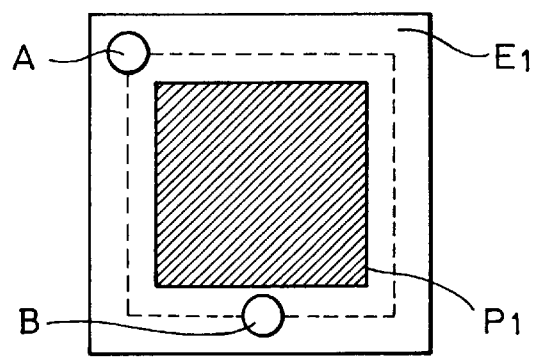
Figure 4C:
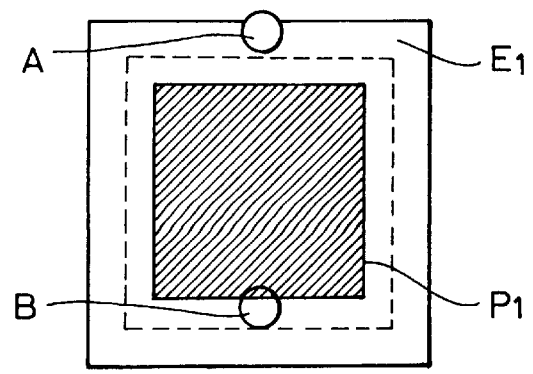

Instead of calculating the bending amount Dt on the basis of the Z-position of the wafer W1 measured by the Z-sensor 31 and the change in gap between the wafer W1 and the membrane E1 of the mask M1 measured by the alignment scope 32, it is also possible to obtain the bending amount Dt of the membrane E1 by using two of the three alignment scopes 32, as shown in FIGS. 4(a) through 4(c). This is conducted as follows:

By the two alignment scopes 32, the distances between the membrane E1 of the mask M1 and the wafer W1 at the measurement points A and B are detected, and the difference between the two outputs, that is, the gap difference ΔGt is calculated. The gap difference when the central portion of the membrane E1 is the permissible value D1 is previously obtained by geometrical calculation or by experiment, and compared with the gap difference ΔDt at the measurement points A and B as the permissible value.

The positional relationship between the measurement points A and B measured by the two alignment scopes 32 must be determined such that the bending amounts are not the same when the membrane E1 is deformed outside the pattern P1 provided on the membrane E1.

For example, as shown in FIG. 4(b), one measurement point A is arranged closer to a corner of the membrane E1, and the other measurement point B is arranged at the center of one side edge of the membrane E1. Alternatively, as shown in FIG. 4(c), the measurement points are arranged at the centers of a pair of sides of the membrane E1, which are opposite to each other, such that they differ in the distance to the pattern P1.

Further, when there is an error in configuration such as corrugation or warpage on the surfaces of the membrane E1 and the wafer W1, the initial value of the difference between the two measurement points A and B is obtained at the retracted position of the wafer W1 beforehand, and the variation after that is regarded as the bending amount of the membrane M1. It is necessary for this initial value to be re-measured each time the step movement of the wafer W1, the replacement of the mask M1, etc., is performed.

Figure 5A:
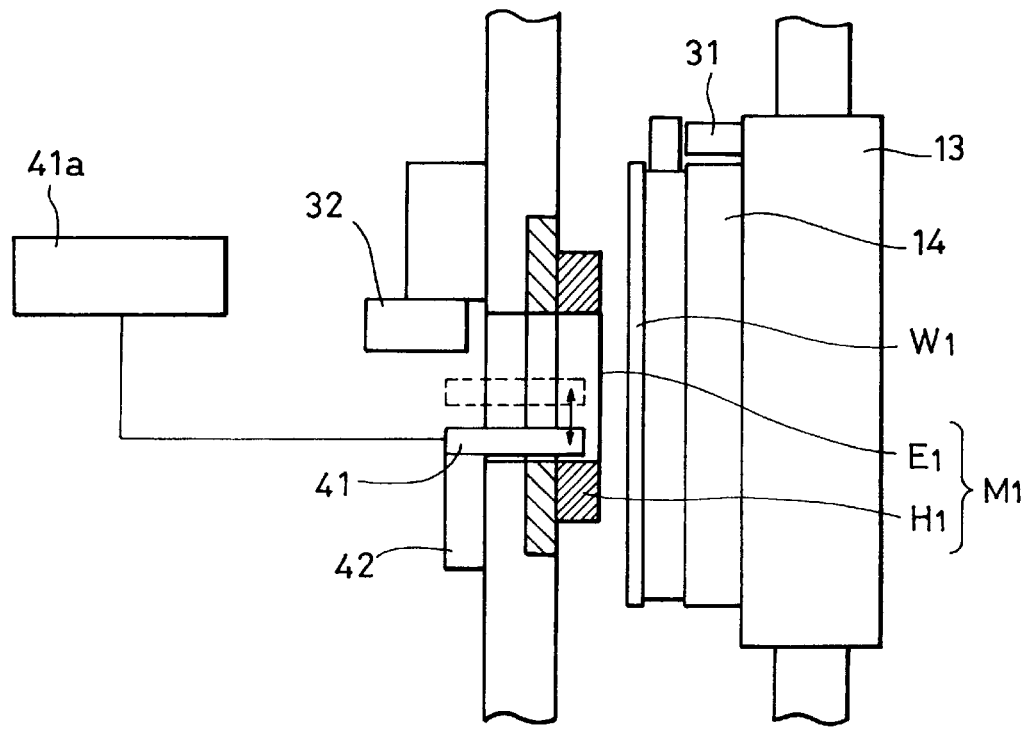
Figure 5B:
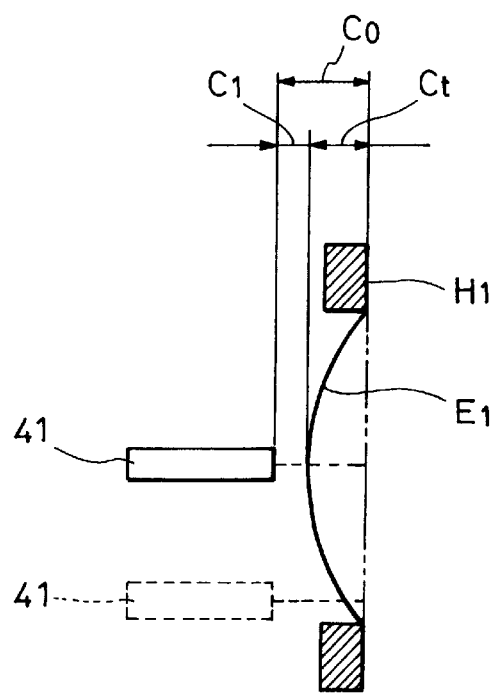

FIGS. 5(a) and 5(b) show still another modification. In this modification, instead of measuring the bending amount of the membrane E1 of the mask M1 by using the output of the alignment scopes 32, the bending amount of the membrane E1 is measured by directly detecting the displacement of the central portion of the membrane E1 by means of a displacement sensor 41 serving as a displacement detecting means. As shown in FIG. 5(b), when the output of the displacement sensor 41 when the wafer W1 is at the retracted position is the initial value C0, the difference Ct between this initial value C0 and the output C1 of the displacement sensor 41 when time t (msec) has elapsed from the start of the exposure gap setting process for the wafer W1, that is, Ct=|C0−C1| directly indicates the bending amount of the membrane E1. Thus, the driving speed of the Z-actuator of the fine movement stage 14 is controlled such that the output Ct of the displacement detecting section 41a does not exceed the permissible value D1 of the bending amount of the membrane E1.

In this modification, the displacement sensor 41 is arranged close to the side of the membrane E1 of the mask M1, that is, opposite to the side facing the wafer W1 to measure the displacement of the central portion of the membrane E1, so that, during exposure, it is necessary for the displacement sensor 41 to be retracted to a side of the membrane E1 (as indicated by the broken line in FIG. 5(b)). In view of this, the displacement sensor 41 is mounted on a uniaxial driving stage 42, and the displacement sensor 41 is moved to the measurement position only when the bending amount of the membrane E1 is to be monitored.

Figure 6:
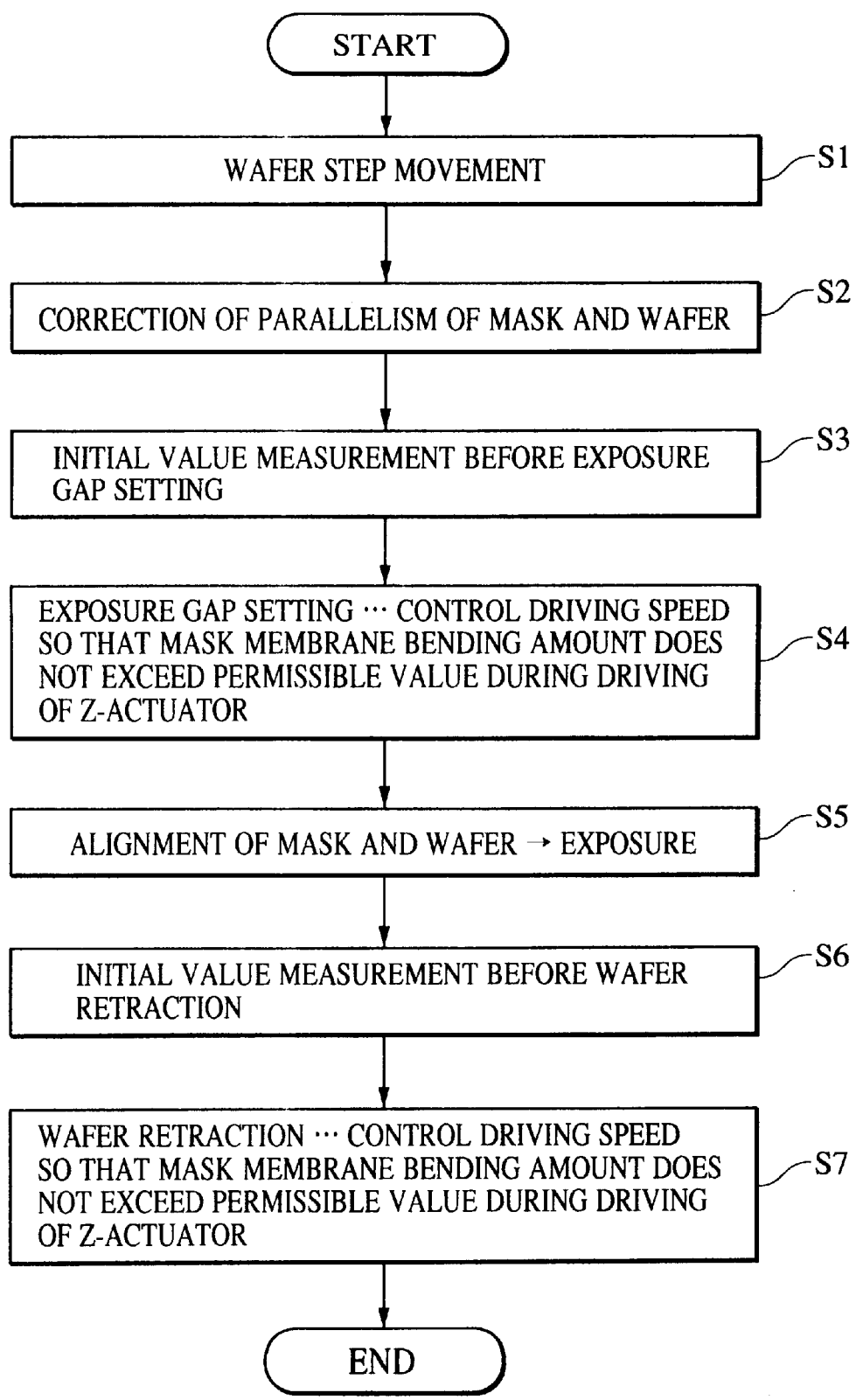
FIG. 6 is a flowchart showing an example of the exposure gap setting sequence.

Next, the sequence for the feed back control of the driving speed of the Z-actuator of the fine movement stage such that the bending amount of the membrane does not exceed the permissible value when setting the wafer exposure gap will be described with reference to the flowchart of FIG. 6.

In step S1, the rough movement stage is moved stepwise so that a predetermined exposure angle of view (the n-th shot) comes under the mask. At this time, to avoid interference between the wafer and the mask, the gap between them is a sufficiently large value taking into account their flatness, the wedge, etc., for example, on the order of 100 μm or more.

In step S2, the gap is measured at three positions by using the alignment scopes, and the fine movement stage is driven to effect correcting of parallelism between the mask and the wafer by driving the fine movement stage.

In step S3, the initial value of the Z-position of the wafer chuck is measured by the Z-sensor, and the initial value of the gap between the membrane of the mask and the wafer is measured by the alignment scopes.

In step S4, exposure gap setting is effected by the fine movement stage. The target value is set, for example, at 30 μm. During driving, the driving speed is feed-back-controlled such that the bending amount of the membrane of the mask does not exceed the permissible value. In step S5, the fine movement stage is driven in the X and Y-directions to effect alignment between the mask and the wafer by using the measurement results of the alignment scopes, and then exposure is effected.

In step S6, after the completion of the exposure, the position of the wafer chuck and the initial value of the gap (distance) between the mask and the wafer are measured as described above.

In step S7, retraction is effected so as to attain the gap during step movement (100 μm). In this case, also, the driving speed of the Z-actuator is feed-back-controlled so that the bending amount of the membrane of the mask does not exceed the permissible value.

Figure 7:
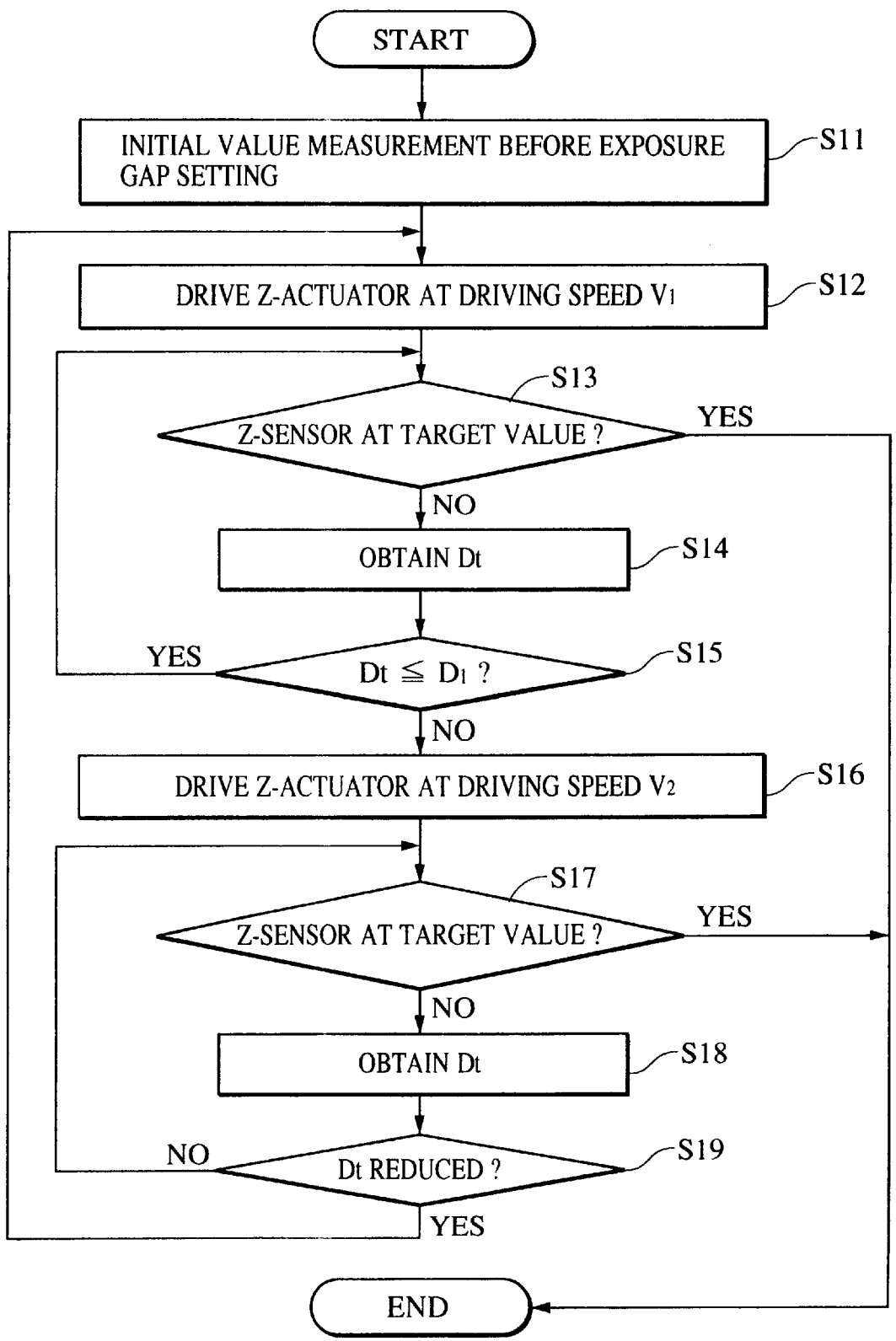
FIG. 7 is a flowchart showing another example of the exposure gap setting sequence.

Instead of this sequence, in which the Z-actuator is constantly feed-back-controlled in accordance with the bending amount of the membrane during the exposure gap setting operation and the retracting operation, it is also possible to adopt a sequence in which, as shown in FIG. 7, the driving speed of the Z-actuator is switched in two stages. This is adopted when performing an exposure gap setting operation. In step S11, the initial value prior to the exposure gap setting is measured as described above and, in step S12, the driving of the Z-actuator is first started at a first driving speed V1. In step S13, a judgment is made as to whether the output of the Z-sensor is not more than the target value and, in step S14, the bending amount Dt of the membrane is measured. In step S15, a judgment is made as to whether the bending amount Dt of the membrane exceeds the permissible value D1 or not. If it does, the driving speed of the Z-actuator is reduced to a second driving speed V2 in step S16. In step S17, the output of the Z-sensor is checked, and then the bending amount Dt of the membrane is measured again in step S18. In step S19, a judgment is made as to whether the bending amount Dt of the membrane has been sufficiently reduced or not. If it has been sufficiently reduced, the procedure returns to step S12, and acceleration to the first driving speed V1 is effected. It is desirable that the second driving speed V2 be set to be sufficiently lower than the first driving speed V1. In some cases, the driving of the Z-actuator may be stopped.

(Second Embodiment)

Next, the construction of an exposure device according to another embodiment will be described.

Figure 8:
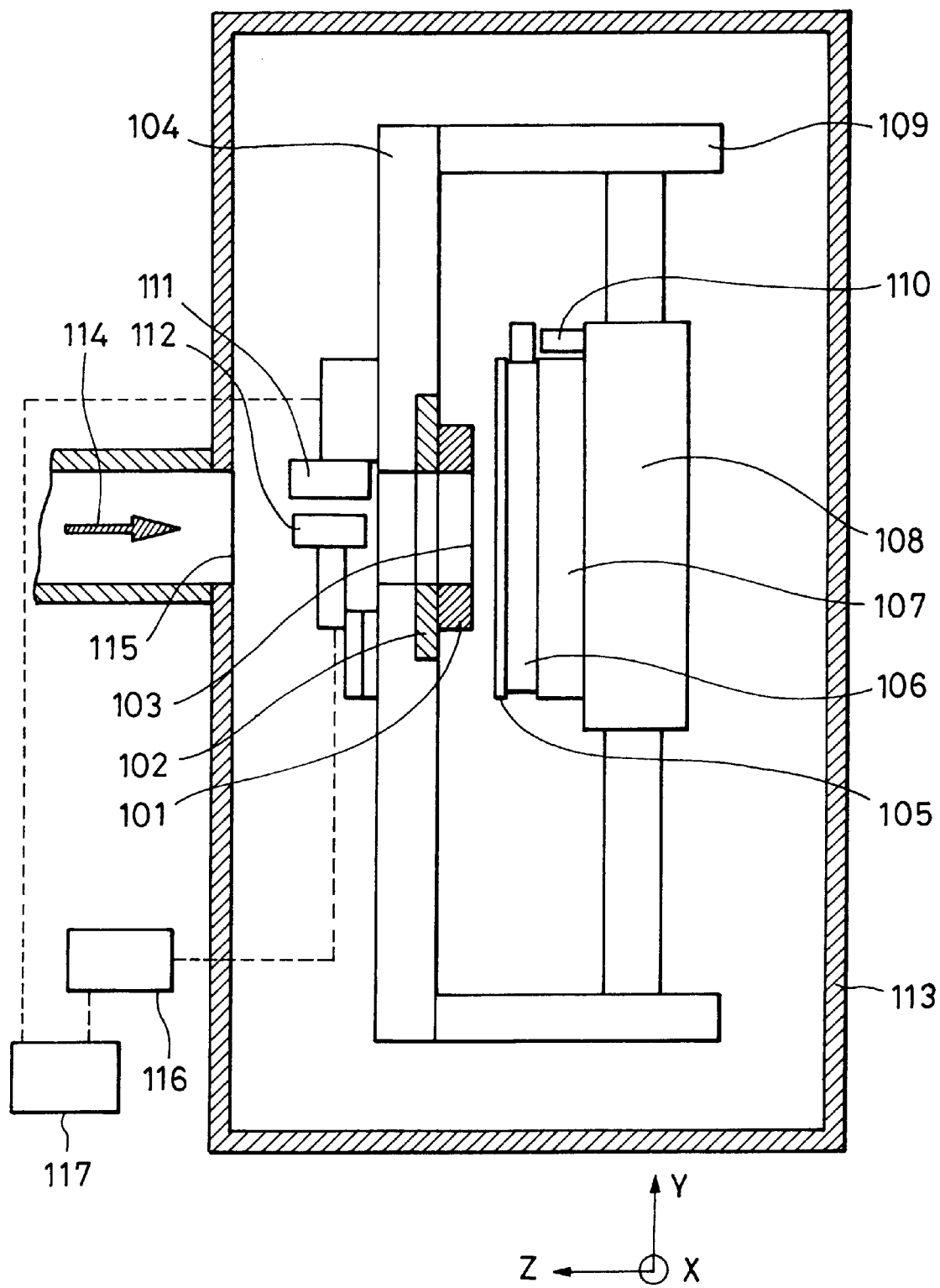
FIG. 8 is a schematic diagram showing an X-ray exposure device according to a second embodiment of the present invention.

In FIG. 8, reference numeral 101 indicates a mask; reference numeral 102 indicates a mask chuck for holding the mask; reference numeral 103 indicates a mask membrane; and reference numeral 104 indicates a mask chuck base. Reference numeral 105 indicates a wafer; and reference numeral 106 indicates a wafer chuck for holding the wafer. Reference numeral 107 indicates a fine movement stage used for the alignment between the mask 101 and the wafer 105; reference numeral 108 indicates a rough movement stage used for movement between the shots; and reference numeral 109 indicates a stage base to which the guide of the rough movement stage 108 is fixed. The wafer 105 and the wafer chuck 106 are mounted on the fine movement stage 107.

Next, the displacement sensor used in this embodiment will be described. Reference numeral 110 indicates a stage Z-sensor for measuring the position of the wafer chuck 106 in the direction perpendicular to the mask 101 (hereinafter referred to as the "Z-direction"); and reference numeral 111 indicates an alignment scope 111 for measuring the distance (hereinafter referred to as the "gap") between the mask membrane 103 and the mask-side surface of the wafer 105 and the in-plane deviation amount therebetween. The alignment scope 111 is mounted on a two-axis stage so that measurement is possible even when the positions of the alignment marks on the mask 101 are displaced. Further, though not shown, three stage Z-sensors 110 and three alignment scopes 111 are provided so that the measurement of planar information is possible. Reference numeral 112 indicates a non-contact displacement gage for measuring the deformation of the mask membrane 103. The non-contact displacement gage 112 is mounted on a uniaxial stage such that it can proceed and retract in the exposure range. The non-contact displacement gage 112 applies a laser beam to the mask membrane 103, and performs measurement by the reflected beam.

The entire device is arranged inside a chamber 113, which is set in a low-pressure helium atmosphere. A synchrotron radiation (SR) beam 114 generated by a light source (not shown) is introduced into the chamber 113 through a shield window 115 (which is usually a Be window). Reference numeral 116 indicates a computing means for calculating the deformation amount of the membrane at the positions of the alignment marks on the mask 101 and the wafer 105 from the deformation amount at one point in the membrane 103 supplied from the non-contact displacement gage 112 and calculating the in-plane deviation of the alignment marks on the mask membrane 103 from the deformation amount of the membrane 103. Reference numeral 117 indicates a processing means for correcting the information obtained by the alignment scopes 111 from the information obtained by the computing means 116.

[Description of the Correction Method]

In the following, the correction of the automatic-focusing (AF) measurement value and the automatic alignment (AA) measurement value due to the deformation amount of the membrane 103 will be described.

Figure 9:
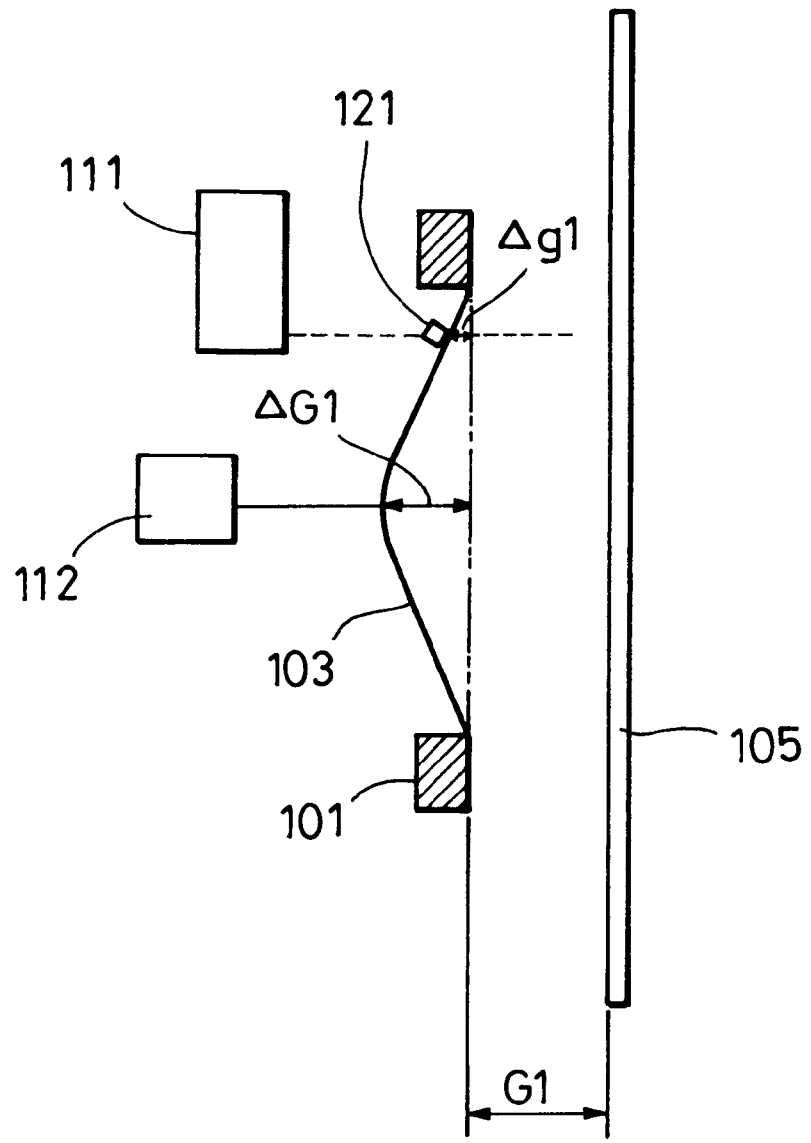
FIG. 9 is a conceptual drawing illustrating an AF measurement value correction method for the device shown in FIG. 8.

(1) Correction of the AF measurement value:

FIG. 9 shows deformation of the membrane 103 at the time of AF measurement and the correction method. As a result of driving from the gap position during step drive and step period to the gap position for the AF measurement, the mask membrane 103 undergoes deformation as indicated by $\Delta G1$ of FIG. 9. When the AF measurement is conducted in this condition, a gap which is larger than the actual gap G1 by $\Delta g1$ at the position of the alignment mark 121 will be measured. When the gap is reduced from this measurement value to the exposure gap, the gap will be set smaller than the predetermined gap by $\Delta g1$, Further, depending upon the value of $\Delta g1$, the wafer 105 and the mask membrane 103 can be brought into contact with each other. To avoid these conditions, the deformation amount $\Delta G1$ of the membrane 103 is measured by the displacement gage 112 simultaneously with the AF measurement, and the deformation amount $\Delta g1$ at the position of the alignment mark 121 is calculated by the computing means 116 to correct the value of $\Delta g1$ with respect to the measured AF measurement value. To calculate the deformation amount $\Delta g1$ at the position of the alignment mark from the deformation amount $\Delta G1$ of the membrane 103 at the deformation measurement position, the calculation may be conducted in the computing means 116 by a formula for calculating $\Delta g1$ from $\Delta G1$. Alternatively, a $\Delta G1-\Delta g1$ correspondence table may be provided in the computing means 116. Further, this table may be prepared on the basis of a formula, or by conducting an experiment in another system to measure the deformation of the membrane 103.

Figure 10:
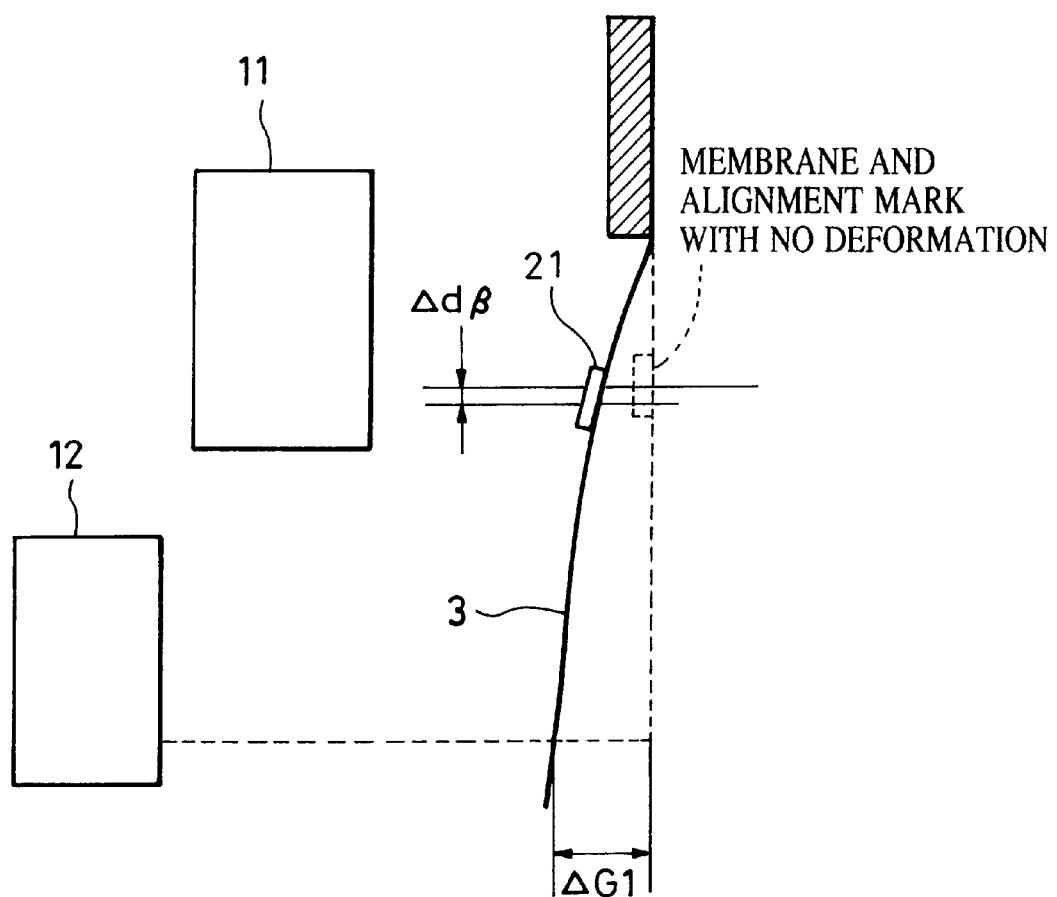
FIG. 10 is a conceptual drawing illustrating an AA measurement value correction method for the device shown in FIG. 8.
Figure 11:
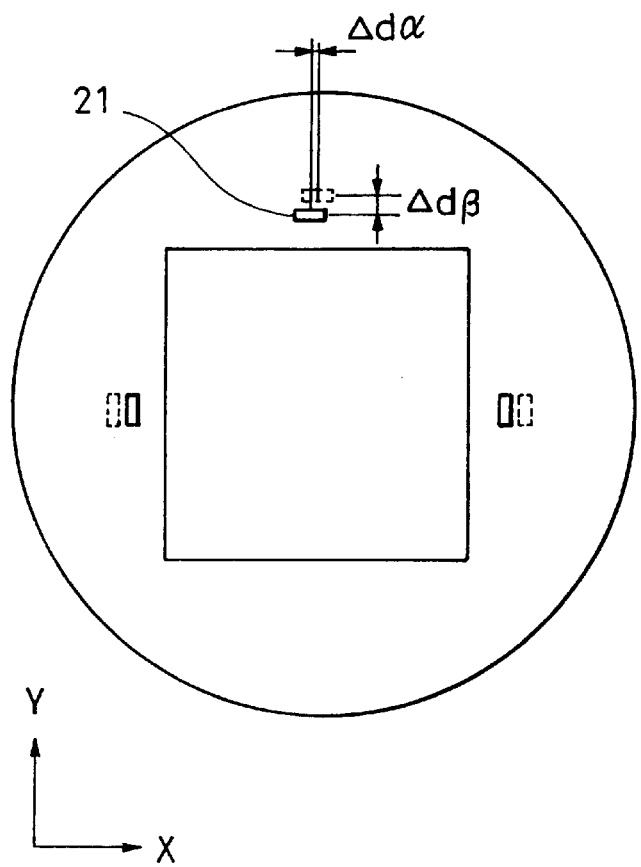
FIG. 11 is a diagram showing the alignment mark shift in FIG. 10 as seen from above.
Figure 12:
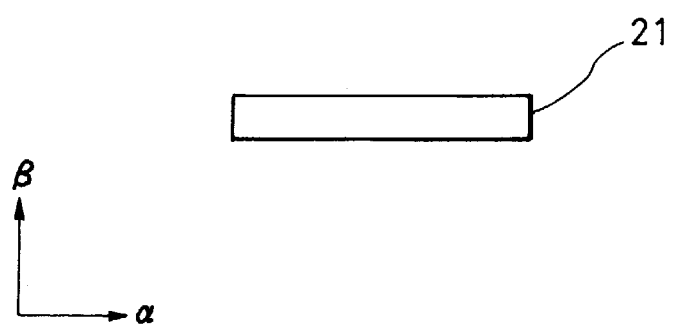
FIG. 12 is a diagram showing the alignment mark coordinate system of FIG. 10.

(2) Correction of the AA value due to deviation of the alignment marks as a result of deformation of the mask membrane 103:

FIG. 10 shows an in-plane deviation of the alignment mark 121 on the mask membrane 103 due to deformation of the mask membrane 103. FIG. 11 shows the deviation of the alignment mark 121 as seen from the Z-direction. FIG. 12 shows the coordinate system ($\alpha$, $\beta$) of the alignment mark 121. There is one direction in which the deviation of the alignment mark 121 can be measured (hereinafter referred to as the "alignment direction") with respect to the mark. Thus, apart from the coordinates of the main body, the coordinates ($\alpha$, $\beta$) are defined.

As shown in FIGS. 10 and 11, when the membrane 103 is deformed in the Z-direction, the position of the alignment mark on the mask membrane 103 moves by $\Delta d\alpha$ in the $\alpha$-direction and by $\Delta d\beta$ in the $\beta$-direction. The method of correcting this deviation will be described below.

When the direction of alignment is in the $\alpha$-direction in FIG. 12, $\Delta d\alpha$ is a deviation in the direction of alignment, which is an error in AA measurement value. Since $\Delta d\beta$ is not in the direction of alignment, $\Delta d\beta$ cannot directly constitute an error in AA measurement value. However, generally speaking, when there is a deviation between alignment marks in the direction perpendicular to the direction of alignment, the error in AA measurement value increases. To correct this, the membrane deformation is measured simultaneously with the AA measurement. From the measured amount of deformation in the Z-direction $\Delta G1$, the in-plane deviation ($\Delta d\alpha$, $\Delta d\beta$) is calculated by the computing means

116. To calculate this deviation (Δdα, Δdβ), a formula for calculating from the deformation amount ΔG1 may be provided in the computing means 116. Alternatively, the relationship between (Δdα, Δdβ) and ΔG1 may be provided beforehand in the form of a table to calculate (Δdα, Δdβ). Further, it is also possible to previously measure by another experiment system the amount of deformation in the Z-direction of the mask membrane 103 at the deformation measurement position and the in-plane deviation at each mark position and provide the results in the form of a table. From this calculated value of (Δdα, Δdβ), the measured AA value is corrected. To correct Δdβ, the influence of the deviation between alignment marks in the direction perpendicular to the alignment direction on the AA measurement value is measured beforehand. This may be measured beforehand on the exposure device, or on an experimental device of another system. Regarding Δdα, the AA measurement value after the correction with Δdβ is further corrected. In the case in which the alignment direction is the β direction in FIG. 12, the α and β of the coordinates are transposed, but the correcting method is the same.

[Explanation of the Exposure Procedures]

Figure 13:
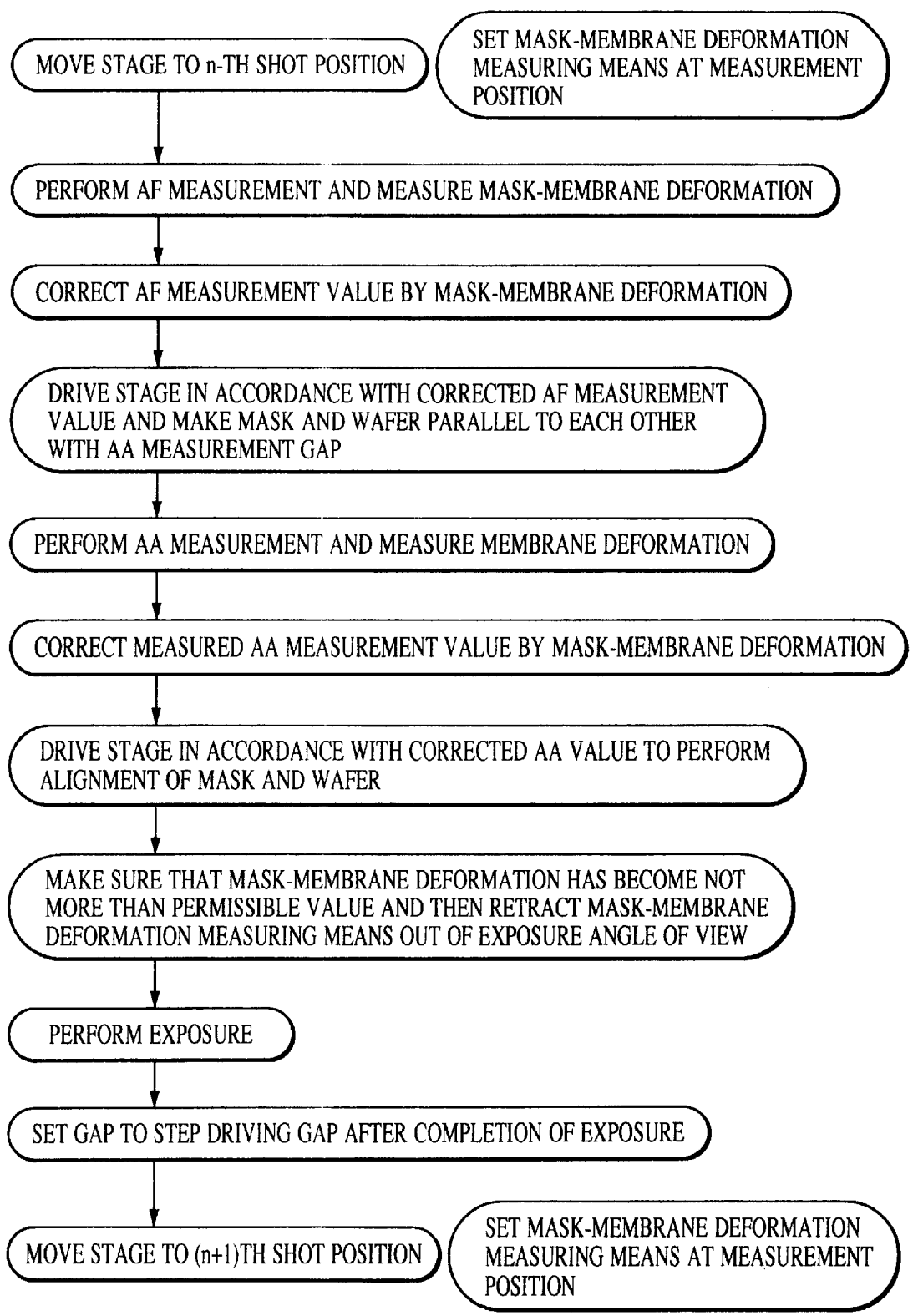
FIG. 13 is a flowchart showing correction procedures for the device shown in FIG. 8.

In the following, the procedures for correcting the AF and AA values from the deformation amount of the membrane will be described with reference to the operation of the exposure device. FIG. 13 is a flowchart showing the procedures.

In the procedures of this embodiment described below, the exposure is performed in the die-by-die system.

First, the rough movement stage 108 is driven stepwise so that the portion of the wafer 105 for the n-th shot exposure comes under the mask 1 (step S1). At this time, to avoid interference between the wafer 105 and the mask 101, the gap between the wafer 105 and the mask 101 during stepping is determined to be a sufficiently large value taking into account their flatness, wedge, etc. In this embodiment, it is 100 μm or more. Further, simultaneously with this step drive, the displacement gage 112 is positioned within the exposure angle of view of the mask membrane.

Next, AF measurement is performed by the alignment scopes 111 (step S2). At the same time, the amount of deformation of the mask membrane 103 is measured by the displacement gage 112. Then, this measured AF measurement value is corrected by the deformation amount of the mask membrane (step S3) and, at the same time, the stage 107 is driven in accordance with this corrected AF measurement value, and the mask 101 and the wafer 105 are made to be parallel to each other at the gap position at the time of AA measurement (step S4).

Next, AA measurement is performed by the alignment scopes 111 and, at the same time, the amount of deformation of the mask membrane 103 is measured (step S5). Then, this measured AA measurement value is corrected by the amount of deformation of the mask membrane 103 (step S6) and, in accordance with the corrected AA measurement value, the fine movement stage 107 is driven to effect the alignment of the mask 101 and the wafer 105 (step S7).

Next, when the amount of deformation of the membrane 103 is not more than the permissible value, the mask membrane deforming means is retracted out of the exposure angle of view (step S8) to perform exposure (step S9). Then, when the exposure is completed, the gap is set to the step drive gap (100 μm) (step S10), and the rough movement stage 108 is driven so that the portion for the (n+1)th shot exposure comes under the mask 101 (step S11).

The above-described steps S1 through S11 are repeated to thereby expose a predetermined shot number on the wafer 105.

In this embodiment, in which, as described above, the AF and AA measurement values are corrected by the amount of deformation of the mask membrane 103, it is possible to perform the AF and AA measurements with high accuracy with the mask membrane 108 deformed, thereby making it possible to achieve an improvement in terms of throughput.

While this embodiment has been described with reference to the die-by-die alignment system, the above-described correction is also effective for the alignment of a mask and a wafer in a global alignment system. Further, the non-contact displacement gage 112 for measuring the deformation of the mask membrane 103 is not restricted to one using a laser. Any type of displacement gage will do as long as it allows displacement measurement in a non-contact state. For example, it is possible to adopt an interferometer for measuring an interference fringe of the mask membrane 103, an air micro, etc.

Further, while this embodiment has been described with reference to the case in which the AF measurement gap and the AA measurement gap (exposure gap) differ from each other, that is, the case in which the AF measurement range is larger than the exposure gap, the above-described correction is also effective for the case in which the AF measurement gap and the AA measurement gap are the same. The correction of the AF measurement value when the AA and AF measurement gaps are set is the same as that when the above-mentioned gaps differ from each other. In the correction at the time of AA measurement, also, a change in gap occurs due to the correction of parallelism between the mask and wafer after the AF measurement, and the membrane 103 is deformed, so that, as in the case in which the AF measurement gap and the AA measurement gap differ from each other, the deformation of the membrane 103 is measured at the time of AA measurement and correction is effected.

(Third Embodiment)

Next, a third embodiment will be described, in which correction is effected when the AA measurement value fluctuates depending upon the gap between the mask and the wafer. In this case, it is necessary to perform, in addition to the correction described with reference to the second embodiment, the correction of the AA measurement value by the amount of deformation of the membrane 103 due to the gap dependency of the AA measurement value. That is, in the method in which the in-plane positional relationship between the mask and the wafer is detected from the center of gravity of the spot of the measurement beam that undergoes diffraction by a diffraction grating formed on the wafer and image formation on a sensor, an error in the AA measurement is generated due to fluctuations in gap for the following reason: the spot which undergoes image formation is formed by combining beams passing two different optical paths, and if the gap between the mask and the wafer fluctuates, there is a difference in light quantity variation between the beams transmitted through the two different optical paths. As a result, an error is generated in the center of gravity of the spot. Further, when, for example, the AA measurement beam is not perpendicular to the wafer surface, such an error is generated regardless of whether the above AA detection method using a diffraction grating is adopted or not.

Figure 14:
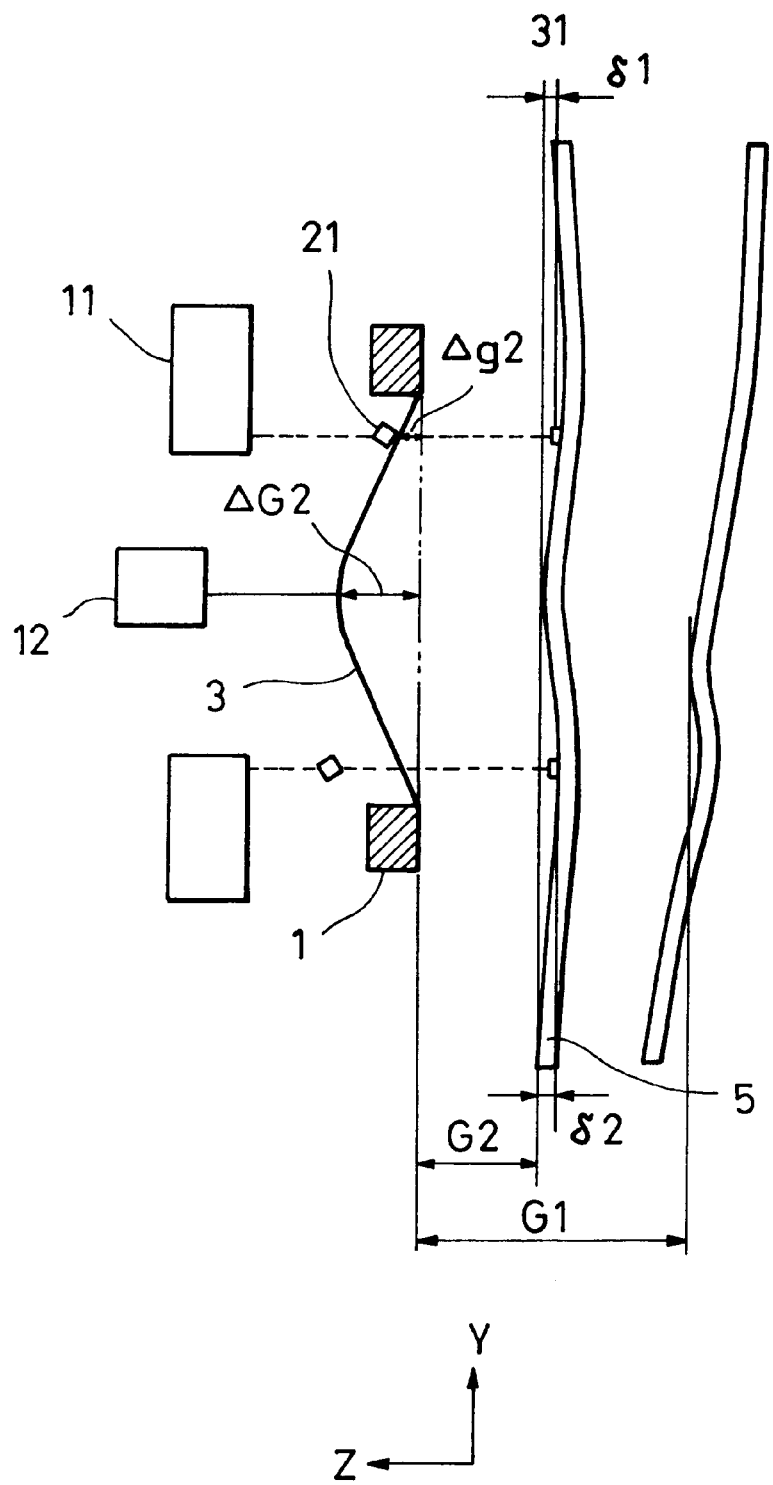
FIG. 14 is a conceptual drawing showing an AA measurement value correction method according to a third embodiment of the present invention.

FIG. 14 is a diagram for illustrating this embodiment. Gap measurement is performed on the AF measurement gap G1, the fine movement stage 107 is driven, the correction of parallelism is effected on the mask 101 and the wafer 105 by reducing the gap to the AA measurement gap G2, and AA measurement is performed. At this time, there is an undulation or the like on the surface of the wafer, and even when the correction of parallelism is effected, there is a difference in gap between the mark positions. In view of this, deviations δ1 and δ2 are calculated from the preset gap values at the mark positions and the correction of the AA measurement value is effected with that value. However, as shown in FIG. 14, the mask membrane 103 is deformed by ΔG2 when the gap is reduced from G1 to G2, and the gap at the time of AA measurement is changed by Δg2 at the position of the alignment mark 121 when compared with that at the time of AF measurement. To correct this, the deformation ΔG2 of the membrane 103 is measured by the displacement measuring means 112 at the time of AA measurement, the deformation Δg2 at the position of the alignment mark 121 is calculated by the computing means 116, and the gap deviations δ1 and δ2 at the mark positions calculated by the value are corrected. The AA measurement value is corrected on the basis of the corrected gap deviations.

By effecting the above correction, high-accuracy positioning is possible even in the AA measurement system in which an error due to a gap is generated in the AA measurement value. The correction flow of this embodiment is the same as the flowchart of the second embodiment shown in FIG. 13, the only difference being the increase in the correction items at the time of AA measurement.

Further, in this embodiment, also, the method proves effective even when the AF measurement gap and the AA measurement gap are the same.

(Fourth Embodiment)

Figure 15:
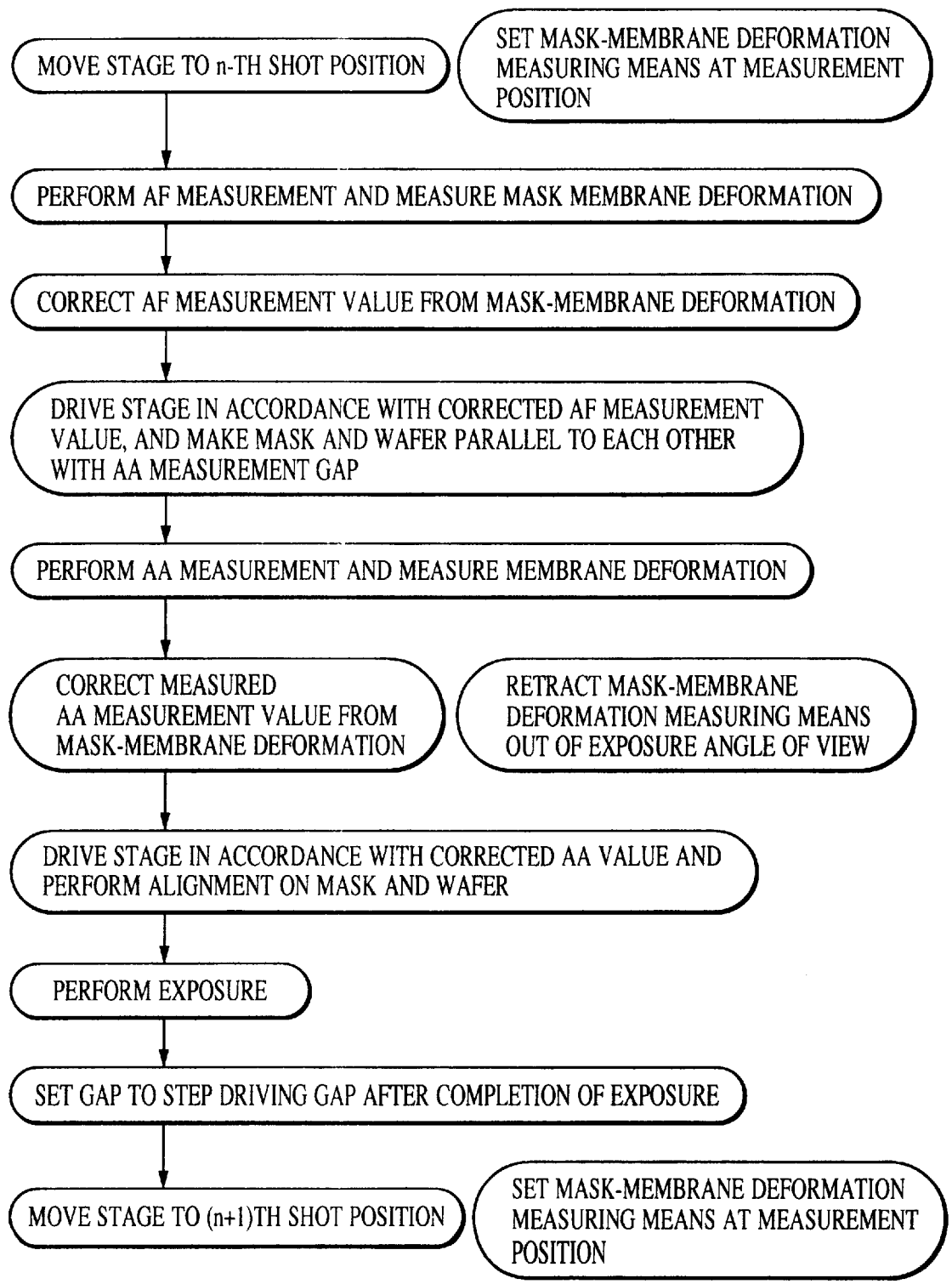
FIG. 15 is a flowchart showing correction procedures according to a fourth embodiment of the present invention.

FIG. 15 is a flowchart showing exposure procedures according to a fourth embodiment of the present invention. In this embodiment, curves representing the displacement and time from the deformation to convergence of the mask membrane are provided in the processing means 117 in the form of a table. After the stage is driven, the displacement is measured once. After that, using the table, the deformation at each point in time is calculated after the time at which the displacement of the membrane 103 is measured. Further, the relationship between the displacement of the membrane 103 and the time is measured by the exposure device beforehand, and stored in the processing means 117. When a further improvement in accuracy is desired, it is effective to provide a table for each mask.

As described above, by providing displacement information in the form of a table, it is only necessary to measure the displacement of the membrane once each time the stage is driven. Immediately after the measurement, the membrane deformation measuring means can retract the displacement gage 112 out of the exposure angle of view (step S81), and exposure can be started without having to wait for the displacement gage 112 to retract after the AA measurement. Thus, it is possible to achieve an improvement in terms of throughput.

(Fifth Embodiment)

Figure 16:
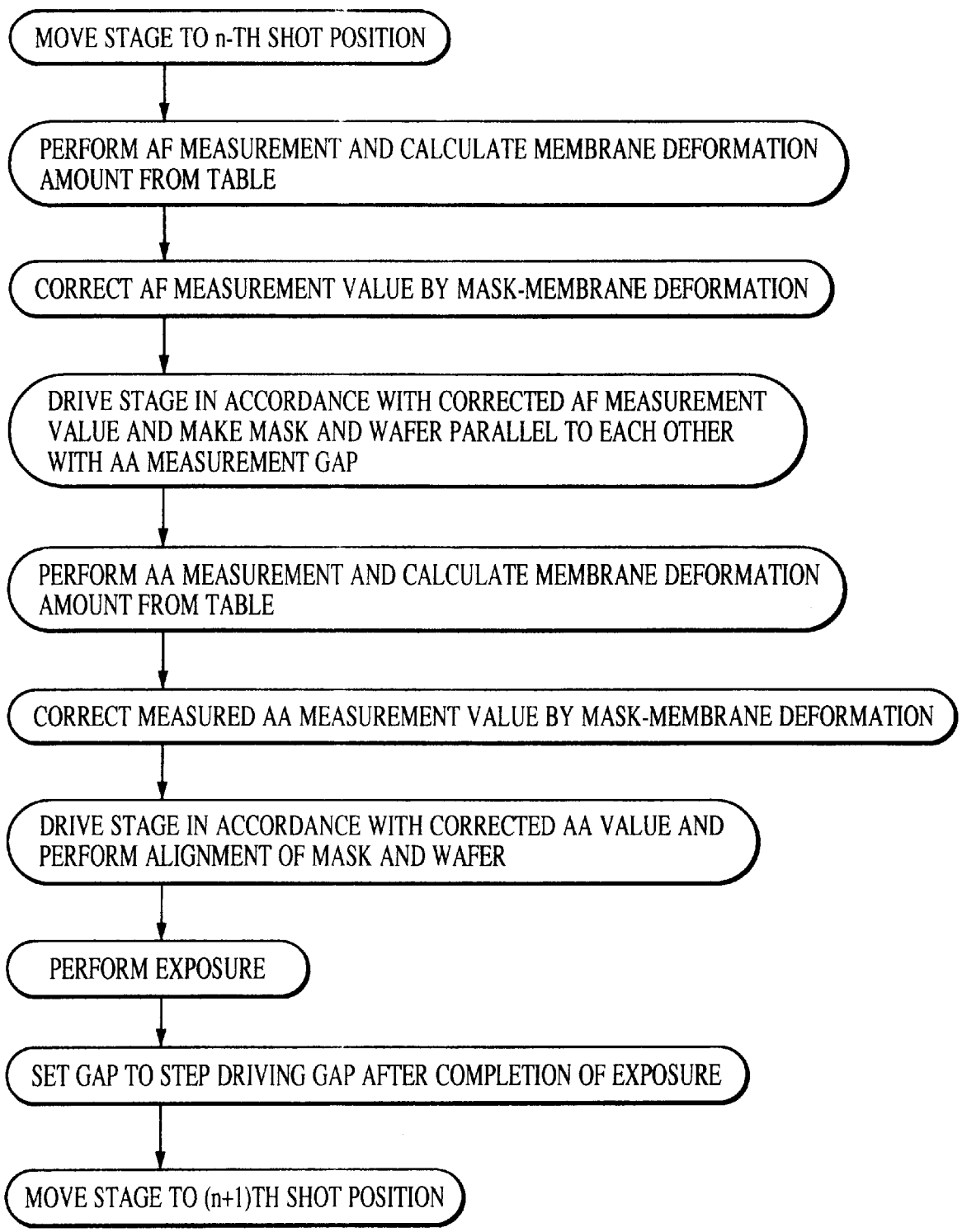
FIG. 16 is a flowchart showing correction procedures according to a fifth embodiment of the present invention.

FIG. 16 is a flowchart showing exposure procedures according to a fifth embodiment of the present invention. In this embodiment, the requisite parameters are selected from among the stage drive patterns, that is, the stage drive amount, the driving speed, the drive initial position, the drive final value and the time after stage positioning, in accordance with the stage driving direction, and a table for calculating the deformation amount of the membrane at that time from those parameters is provided in the computing means 116, whereby the deformation amount of the membrane 103 at the time of AF and AA measurement is calculated by the computing means 116, using the stage drive pattern immediately before the measurement and the time from the stage positioning to the measurement as parameters (step S92). On the basis of this calculated deformation of the mask membrane 103, the AF and AA measurement values are corrected as shown in the second and third embodiments. To prepare the table of the stage drive pattern, the time after stage positioning and the deformation amount of the membrane 103, the main body of the device is used, measuring the deformation of the membrane 103 by providing the main body with a membrane deformation measuring means of a different system from the main body. Alternatively, the table may be prepared by measuring the deformation amount of the membrane 103 by an experimental device different from the main body. By providing this table of the stage drive pattern, the time after stage positioning, and the deformation amount of the membrane 103, there is no need to provide the main body with a measuring means for measuring the deformation of the membrane 103, thereby simplifying the construction of the device.

(Sixth Embodiment)

Figure 17:
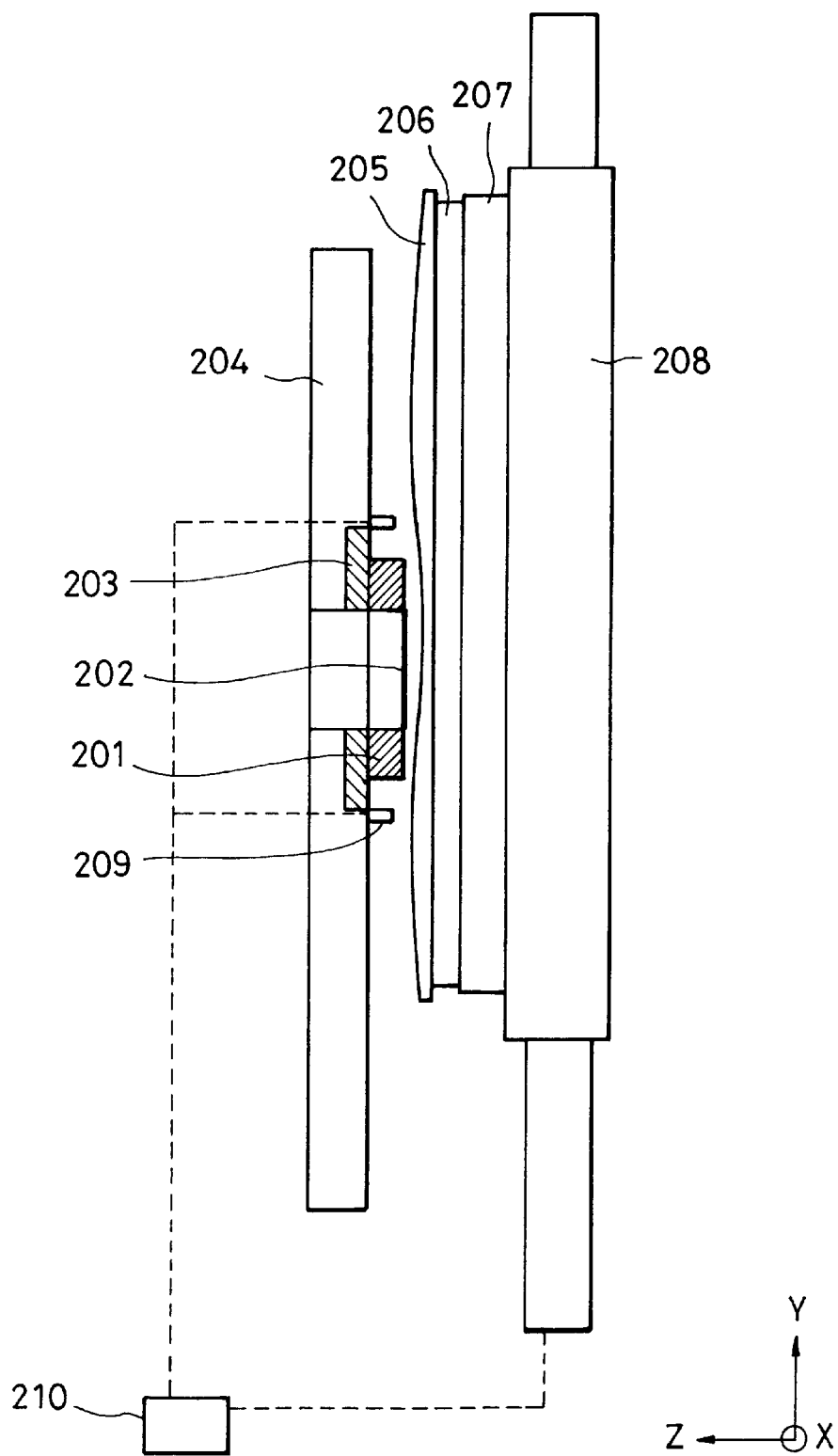
FIG. 17 is a schematic sectional view showing the construction of a device according to a sixth embodiment of the present invention.

FIG. 17 is a diagram illustrating the construction of the X-ray exposure device of a sixth embodiment together with a corresponding coordinate system.

In FIG. 17, reference numeral 201 indicates a mask, reference numeral 202 indicates a mask membrane, reference numeral 203 indicates a mask chuck for holding the mask 201, and reference numeral 204 indicates a mask chuck base. Reference numeral 205 indicates a wafer, and reference numeral 206 indicates a wafer chuck for holding the wafer 205. Reference numeral 207 indicates a fine movement stage used for the alignment of the mask 201 and the wafer 205, and reference numeral 208 indicates a rough movement stage used for the movement between the shots. Reference numeral 209 indicates a non-contact displacement gage for measuring the height of the surface of the wafer 205 from the mask chuck 203 side. This displacement gage 209, which is capable of measuring the height of the wafer 205 on a non-contact basis, may, for example, be one which applies a laser beam to the wafer 205 to measure from the reflected beam, one which measures from electrostatic capacity, or the like. To obtain surface information on the wafer 205, at least three non-contact displacement gages 209 are necessary. Reference numeral 210 indicates a stage control means for controlling the stage height from the measurement value of the distance measuring sensor 209.

Figure 18:
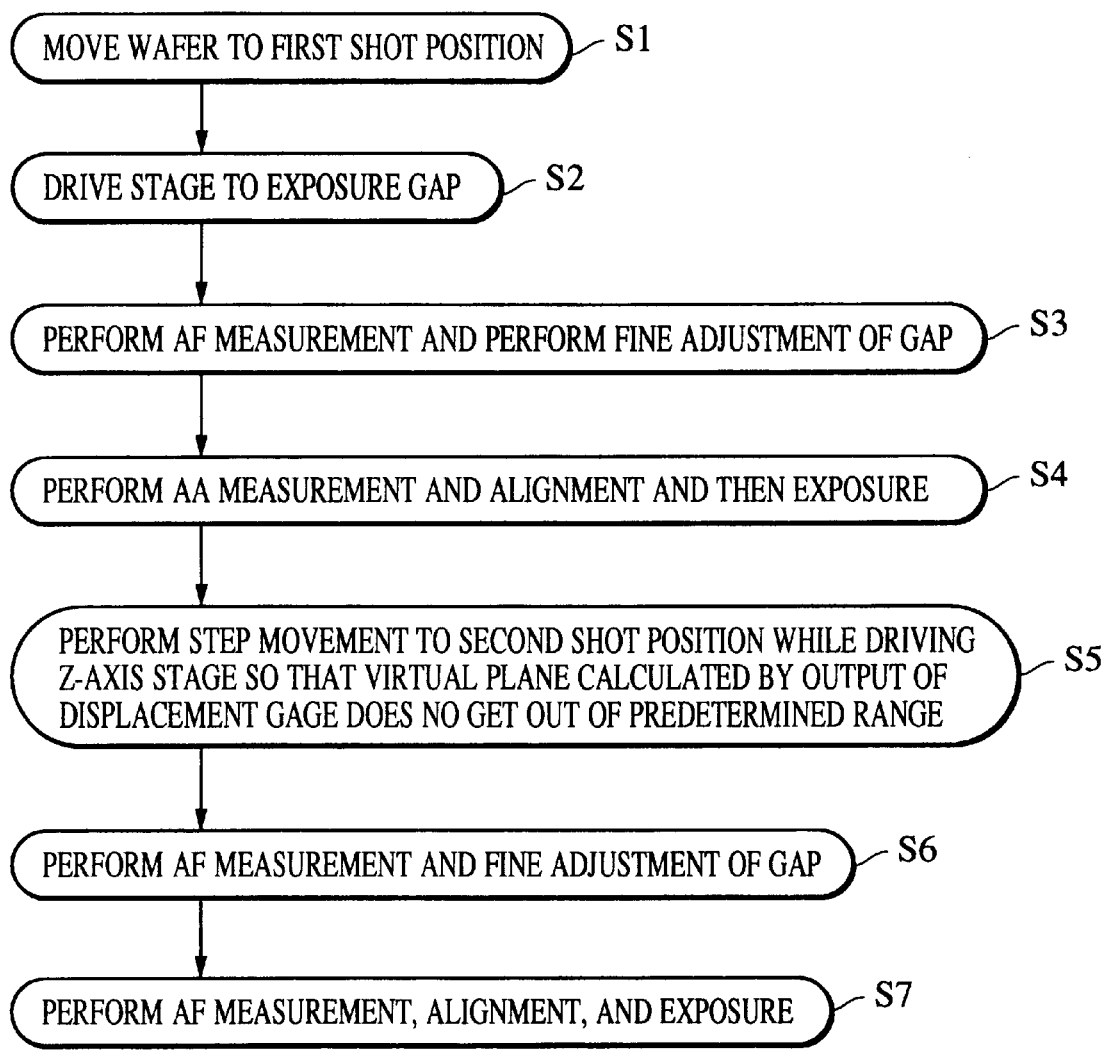
FIG. 18 is a flowchart showing exposure procedures.
Figure 19:
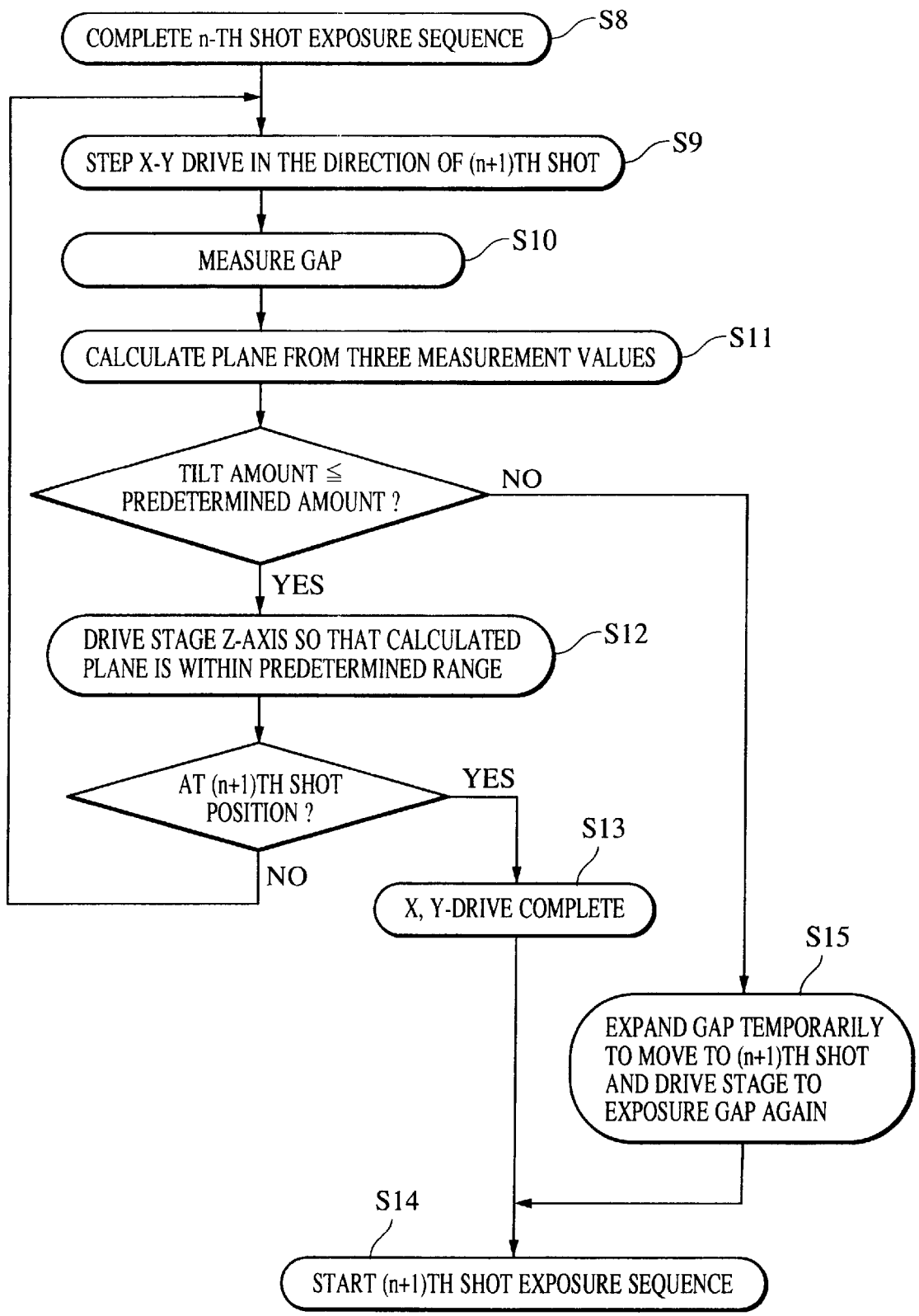
FIG. 19 is a flowchart showing wafer height error detecting procedures.

In the following, a method of effecting height control during step movement of the stage will be described with reference to the flowcharts shown in FIGS. 18 and 19.

(1) The first shot position of the wafer is moved to a position under the mask by the rough movement stage 208 (step S1). At this time, the gap between the mask 201 and the wafer 205 is larger than the gap at the time of exposure.

(2) The fine movement stage 207 is driven in the Z-axis direction in accordance with the output of the non-contact displacement gage 209 and the distance between the mask 201 and the wafer 205 is set (step S2). The gap at this time is calculated as follows: the height of the mask 201 is measured beforehand by a system other than the exposure device and the value thus obtained is stored in the stage control means 210 as data for each mask. The calculation is conducted from the measurement value of the non-contact displacement gage 209 and the data regarding the mask height.

(3) Fine adjustment of the gap is conducted by a mask/wafer position measuring means (not shown) which is of a different system from the non-contact displacement gage 209 (step S3), and exposure is conducted after the alignment (step S4).

(4) After the completion of the exposure, the wafer 205 is moved to the second shot position by the rough movement stage 208 without changing the gap (step S5). As will be described in more detail below, the rough movement stage 208 is driven to effect movement to the second shot position while controlling the position in the Z-axis direction of the fine movement stage 207 by the stage control means 210 such that the spatial position of the virtual plane of the wafer calculated from the output of the three non-contact displacement gages 209 is always within a predetermined range.

(5) When the wafer 205 has been moved to the second shot position, fine movement of the gap is effected by the mask/wafer position measuring means (not shown) (step S6), and exposure is effected after the alignment (step S7).

From this point onward, the procedures of (4)–(5) are repeated to perform exposure on the wafer 205 a predetermined number of shots.

Further, when the tilt amount of the stage at the time of step drive exceeds a predetermined amount, the deformation amount of the wafer 205 is large and there is the possibility that the wafer 205 will collide with the mask 201, so that the gap is temporarily expanded and movement to the next shot is effected, starting exposure by the same sequence as that of the first shot.

Further, in step S5, when the tilt amount of the stage at the time of step drive exceeds the predetermined amount, the deformation amount of the wafer 205 is large and there is the possibility of the wafer 205 colliding with the mask 201, so that the gap is temporarily expanded and movement to the next shot is effected, exposure being started by the same sequence as that of the first shot. FIG. 19 is a flowchart showing in detail the procedures for detecting such an error in wafer height. The flowchart shows the process conducted when the stage is driven in the X- and Y-directions from the n-th to the (n+1)th shot.

In the following, this processing at the time of step drive will be described in more detail with reference to FIG. 19.

When the exposure sequence of the n-th shot has been completed (step S8) and step movement to the next shot, i.e., the (n+1)th shot, is to be effected, the step is moved in the X- and Y-plane in the direction of the (n+1)th shot while keeping the gap between the mask 201 and the wafer 205 the same as that at the time of exposure (step S9). Next, from the output of the three non-contact displacement gages 209, the spatial position of the virtual plane of the wafer 205 is calculated (step S11). When this position is within a predetermined range, the procedure advances to step S12, in which the position in the Z-axis direction of the fine movement stage 207 is controlled by the stage control means 210, and the procedures from step S9 are repeated. When the wafer 205 has been moved to the (n+1) position by repeating the procedures of steps S9 through S12, the movement in the X-Y plane is terminated, and the exposure sequence for the (n+1)th shot is started (step S14). That is, processing similar to steps S3 and S4 or steps S6 and S7 of FIG. 17 is conducted.

On the other hand, when the spatial position of the virtual plane of the wafer 205 calculated from the output of the three non-contact displacement gages 209 is beyond the predetermined range, the procedure advances to step S15, in which the gap is temporarily expanded and the stage is moved to the (n+1)th shot, the fine movement stage 207 being driven in the Z-axis direction in accordance with the output of the non-contact displacement gages 209, as in the case of the first shot, to thereby set the distance between the mask 201 and the wafer 205 (step S15). Then, the exposure sequence for the (n+1)th shot is started (step S14).

By performing the above processing, step drive is effected while keeping the gap between the mask 201 and the wafer 205 at the gap at the time of exposure as long as the tilt amount of the stage during step drive does not exceed the predetermined amount.

Figure 20:
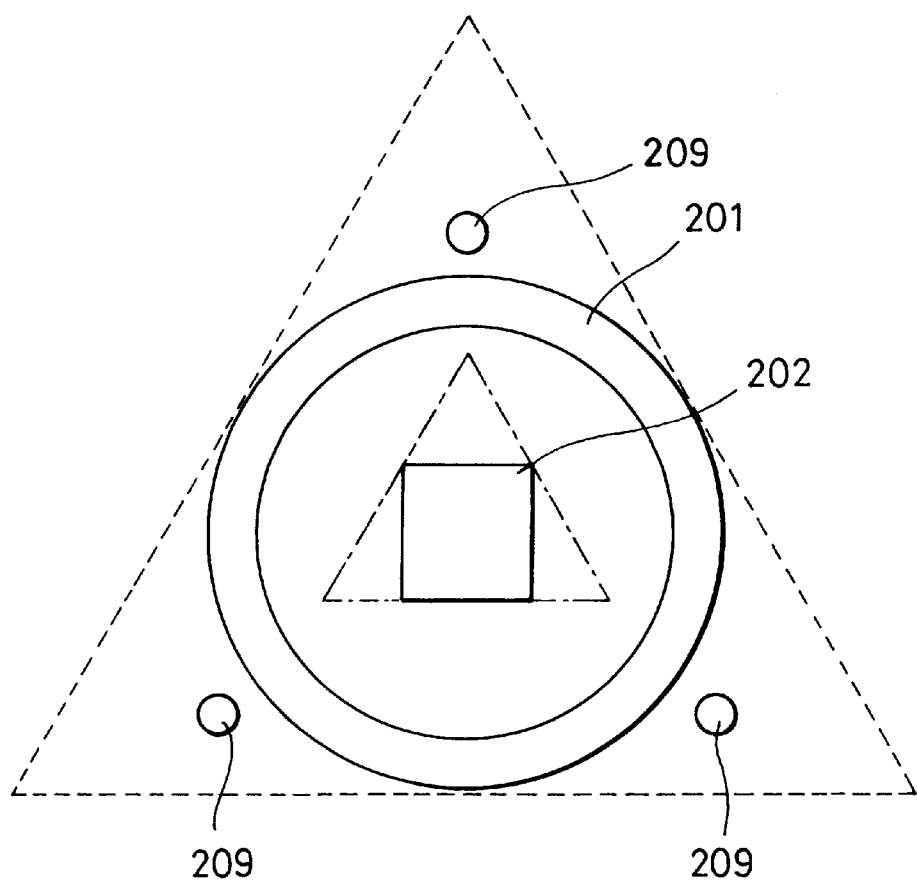
FIG. 20 is a schematic plan view showing a displacement gage arrangement.

Next, with reference to FIG. 20, the arrangement of the non-contact displacement gages 209 will be described. FIG. 20 is a diagram showing the mask 1 used in this embodiment as seen from the wafer 205 side. In FIGS. 17 and 20, the same reference numerals indicate the same components.

When measuring the distance between the mask 201 and the wafer 205, step movement is effected in this embodiment while maintaining the exposure gap, so that there is the possibility of the membrane 202 vibrating during the step movement, thereby making it impossible to perform correct measurement. Thus, instead of adopting the method in which the means for measuring the distance during the step movement directly measures the distance between the mask 201 and the wafer 205 through the membrane 202, a more appropriate method is adopted in which the height of the wafer 205 is measured and the distance is calculated from the height of the mask 201 measured beforehand. Further, to keep the deformation of the mask membrane 202 within a predetermined degree, it is necessary for the pressure change between the membrane 202 and the wafer 205 to be not more than a predetermined value. For that purpose, the variation in the volume of the space between the membrane 202 and the wafer 205 must be set to be not more than a predetermined value.

Thus, it is more effective when the space surrounded by the points measured by the non-contact displacement gages 209 and the virtual plane calculated from the measured values contains the space surrounded by the mask membrane 202 and the wafer 205. Thus, in this embodiment, the non-contact displacement gages 209 are arranged outside the n-angle figure (n=the number of non-contact displacement gages 209) circumscribed by the mask membrane 203. Further, when the height of the wafer 205 is measured in too large a range, the difference between the calculated virtual plane and the actual wafer surface becomes large. Thus, as shown in FIG. 19, the proper positions of the non-contact displacement gages 209 are inside a circle circumscribed by the mask 201. However, the effects of the present invention can be obtained with sensor arrangements other than the one described above.

As described above, step movement is effected while adjusting the gap between the mask membrane 202 and the wafer 205 such that the variation in the volume of the space between the mask membrane 202 and the wafer 205 is kept at a predetermined value or less by the measurement value of the gap between the mask membrane 202 and the wafer 205, whereby it is possible for the deformation of the mask membrane 202 to be not larger than a predetermined value, which leads to the following advantages:

(1) The AF and AA measurements can be performed with high accuracy.

(2) An improvement in image performance can be achieved.

(3) Since the gap is not expanded for each shot, the step movement can be effected quickly, thereby achieving an improvement in throughput.

While this embodiment has been described with reference to a die-by-die alignment system, the above-described step movement method is also effective for mask/wafer alignment measurement and exposure of using a global alignment system.

Further, while in this embodiment the height of the wafer stage is adjusted for the gap adjustment, it goes without saying that the same effects can be obtained by effecting height adjustment on the mask stage side.

(Seventh Embodiment)

Figure 21:
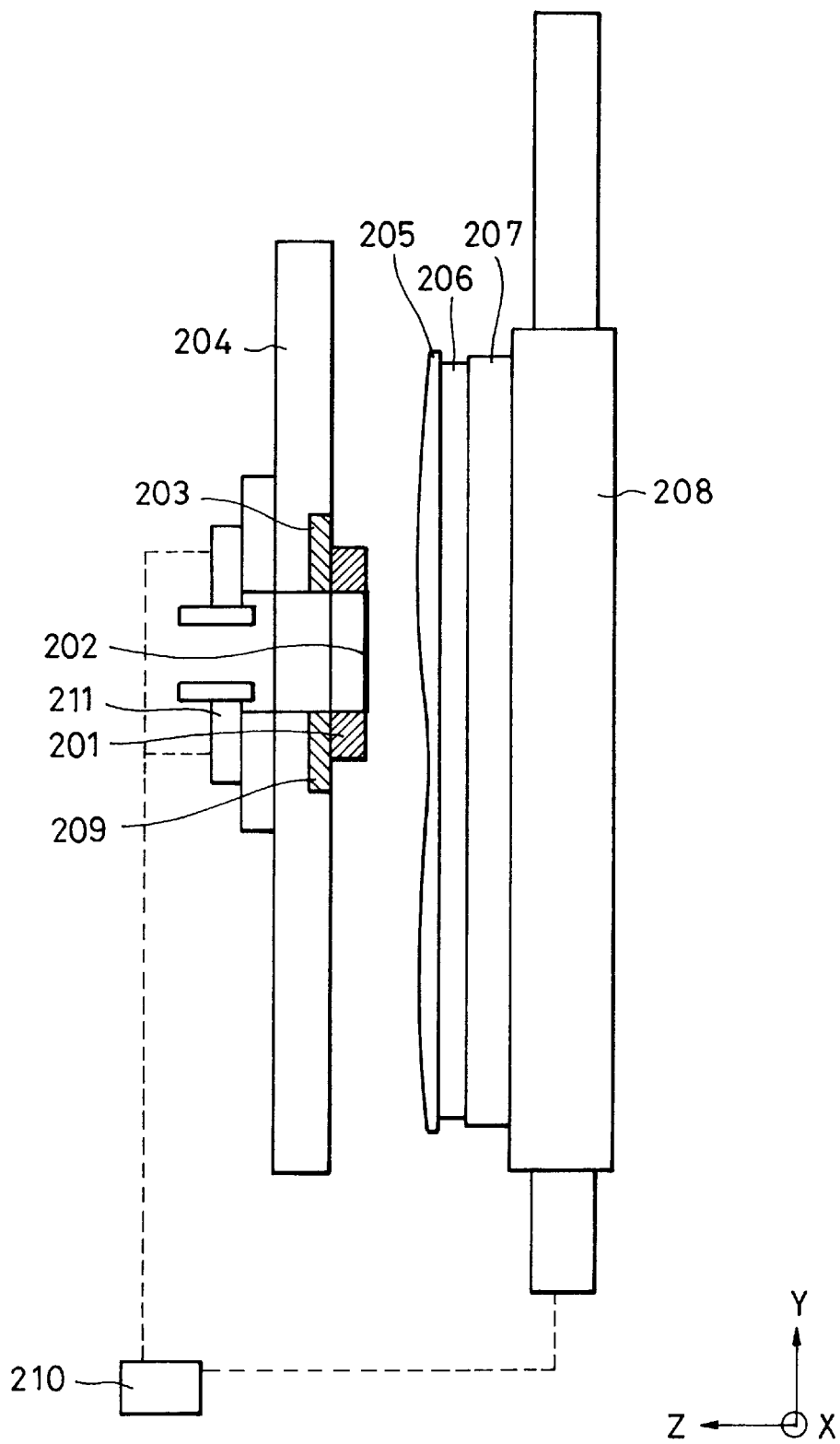
FIG. 21 is a schematic sectional view showing the construction of a device according to a seventh embodiment of the present invention.

In a seventh embodiment, overall measurement of the height of the chucked wafer 205 is conducted to perform mapping of the height of the wafer 205. FIG. 21 is a diagram showing an exposure device according to this embodiment. In the drawing, reference numeral 211 indicates a measuring means for measuring the distance between the mask 201 and the wafer 205.

Figure 22:
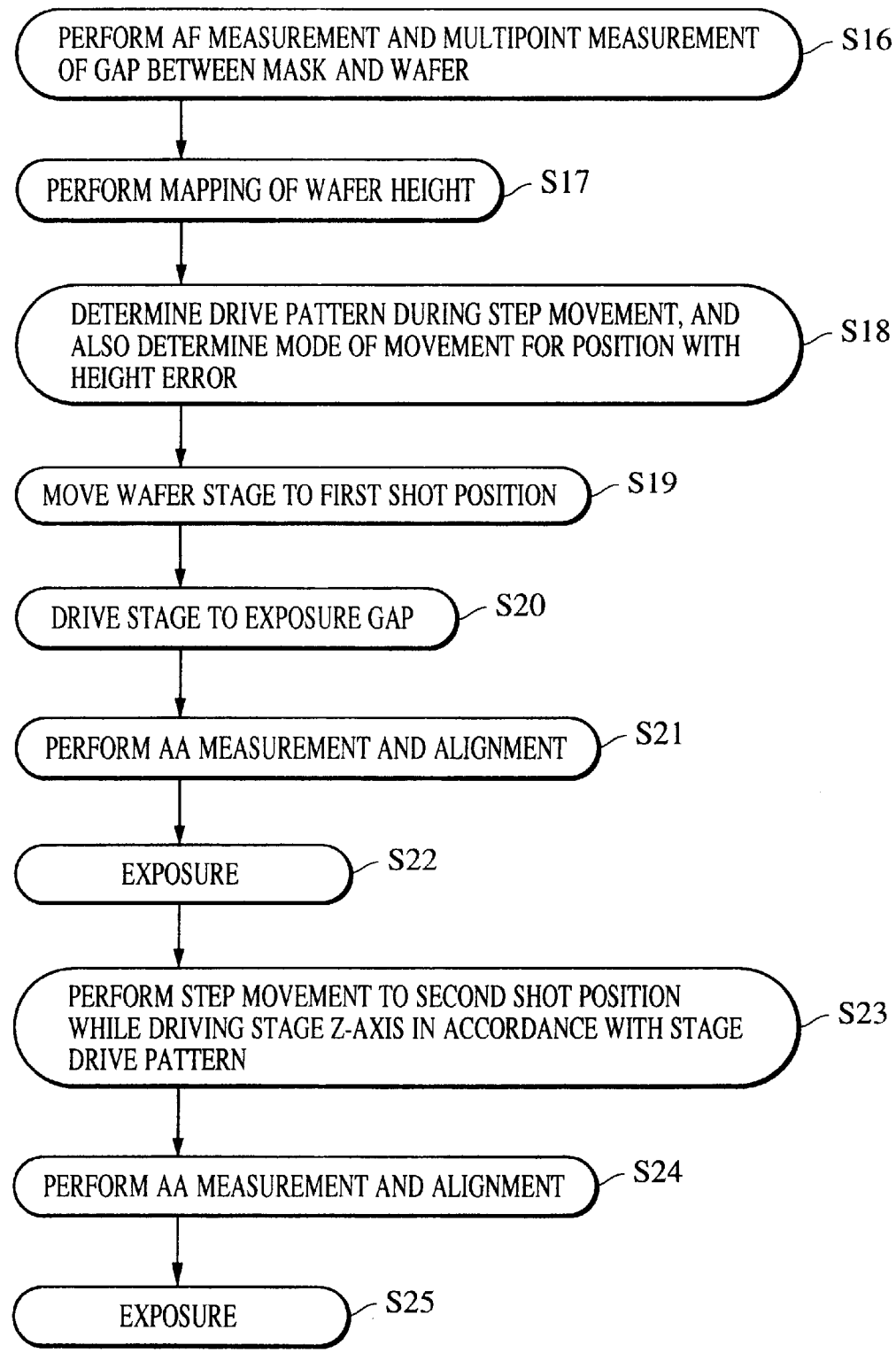
FIG. 22 is a flowchart showing exposure procedures.

In the following, the present invention will be described with reference to the operation of the exposure device. FIG. 22 is a flowchart illustrating the operation.

(1) Multi-point measurement by measuring means 211 is performed on the distance between the wafer 205 and the mask 201, which are chucked with a gap which will not cause deformation even if step movement of the stage is effected (step S16).

(2) The information obtained in (1) is processed and mapping is performed on the height of the entire wafer and loaded to the stage control means 210 (step S17).

(3) In the stage control means 210, the height and attitude of the wafer 205 when it passes under the membrane 202 is calculated on the basis of the map so that the variation in the volume of the space between the mask membrane 202 and the wafer 205 in the step movement path is not more than a predetermined value. For this purpose, the path of movement when step movement from the n-th to the (n+1)th shot is effected is divided, for example, into ten sections, and the attitude of the stage in each of the ten sections is determined from the prepared map such that the volume of the portion between the membrane 202 and the wafer 205 is within a predetermined range in the ten sections, whereby the path when movement from the n-th to the (n+1)th shot is effected is a smooth drive connecting the attitudes in the ten sections. Further, apart from the method in which volume calculation is conducted, a method is also available according to which the attitude of the stage is calculated such that the height of the wafer 205 at the membrane center at each position and the normal vector of the wafer surface at that position are within predetermined ranges. By the above methods, the drive path for one wafer is determined (step S18).

(4) The wafer 205 is moved to the first shot position while adjusting the height of the wafer 205 in accordance with a stage drive path determined beforehand (step S19).

(5) The mask 201 and the wafer 205 are aligned with each other and exposure is performed (steps S20 through S22).

(6) The wafer 205 is moved to the second shot position while adjusting the height of the wafer 205 in accordance with a stage drive path determined beforehand (step S23).

(7) The mask 201 and the wafer 205 are aligned with each other and exposure is performed (steps S24 and S25).

From this point onward, procedures similar to those of (6)–(7) are repeated, and exposure is effected on the wafer 205 a predetermined number of shots.

Further, at a position where the deformation of the wafer 205 is large as a result of mapping so that the setting of the gap is impossible, the stage is moved with the gap expanded. Further, the stage is controlled such that shots which do not allow gap setting are skipped over.

As described above, the height of the wafer 205 is mapped beforehand by the means for measuring the distance between the mask 201 and the wafer 205, and the drive path for the stage is determined beforehand, whereby the following advantages are achieved:

(1) There is no need to adjust the gap at each shot position, thereby achieving an improvement in throughput.

(2) The position where the deformation is large can be specified beforehand, so that there is no need to make an error judgment for each shot, thereby achieving an improvement in throughput.

(3) By statistical processing of height information, it is possible to calculate the height distribution of the entire wafer, thereby making it possible to adjust the distance between the mask and the wafer more accurately.

Next, an embodiment of a device producing method using the above-described exposure device will be described.

Figure 23:
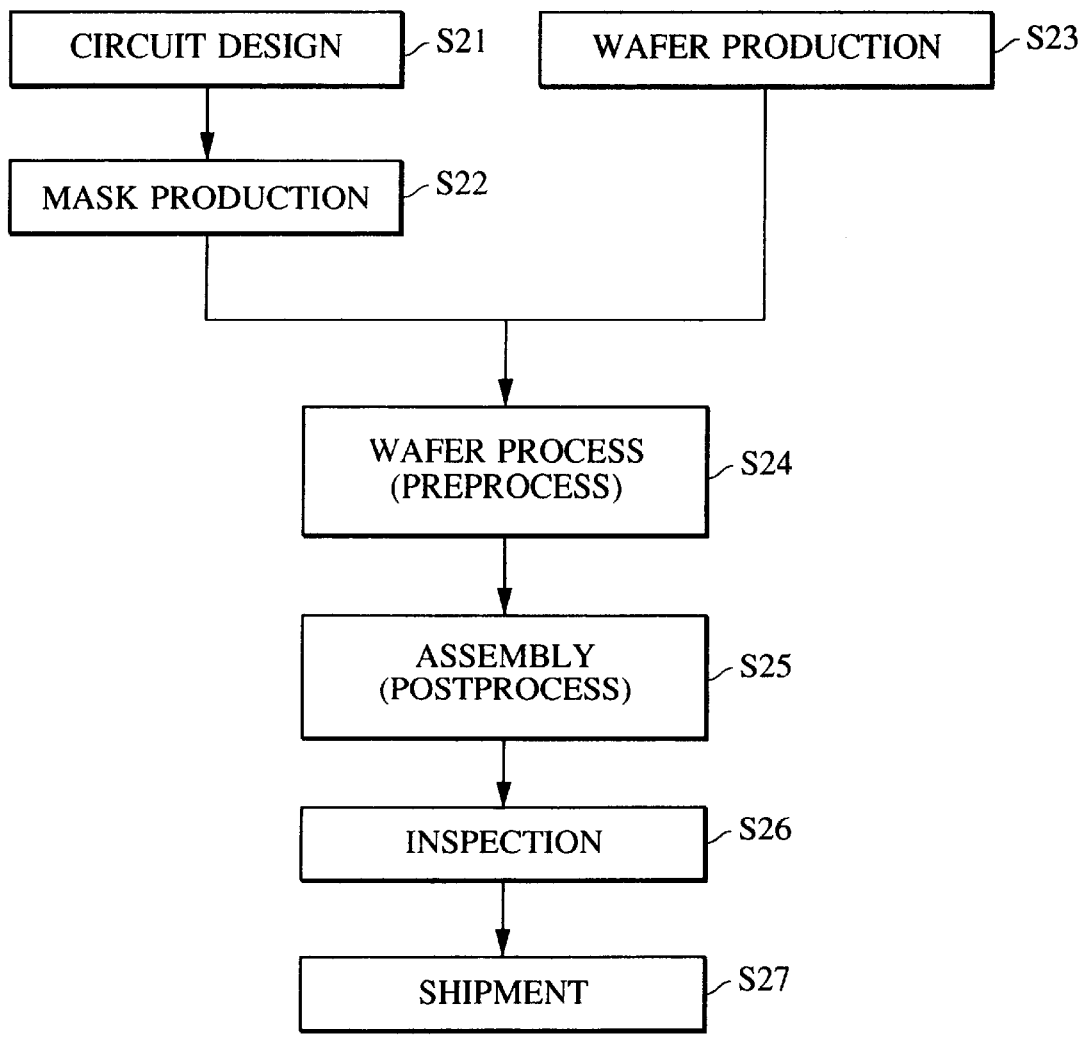
FIG. 23 is a diagram showing a flowchart for semiconductor device production.

FIG. 23 is a flowchart showing a production flowchart of a minute device (e.g., a semiconductor chip such as an IC or an LSI, a liquid crystal panel, a CCD, a thin-film magnetic head, a micro machine or the like). In step 1 (circuit design), the circuit design of a semiconductor device is conducted. In step 2 (mask production), a mask on which the designed circuit pattern is formed is produced. In step 3 (wafer production), a wafer is produced by using a material such as silicon. In step 4 (wafer process), which is called a preprocess, the actual circuit is formed on the wafer by lithography by using the prepared mask and wafer. In step 5 (assembly), which is called a postprocess, a semiconductor chip is obtained by using the wafer prepared in step 4, the step including processes such as assembly (dicing, bonding), packaging (chip sealing), etc. In step 6 (inspection), testing operations such as an operation checking test, a durability test, etc., are performed on the semiconductor device produced in step 5. Through these steps, the semiconductor device is completed and shipped (step 7).

Figure 24:
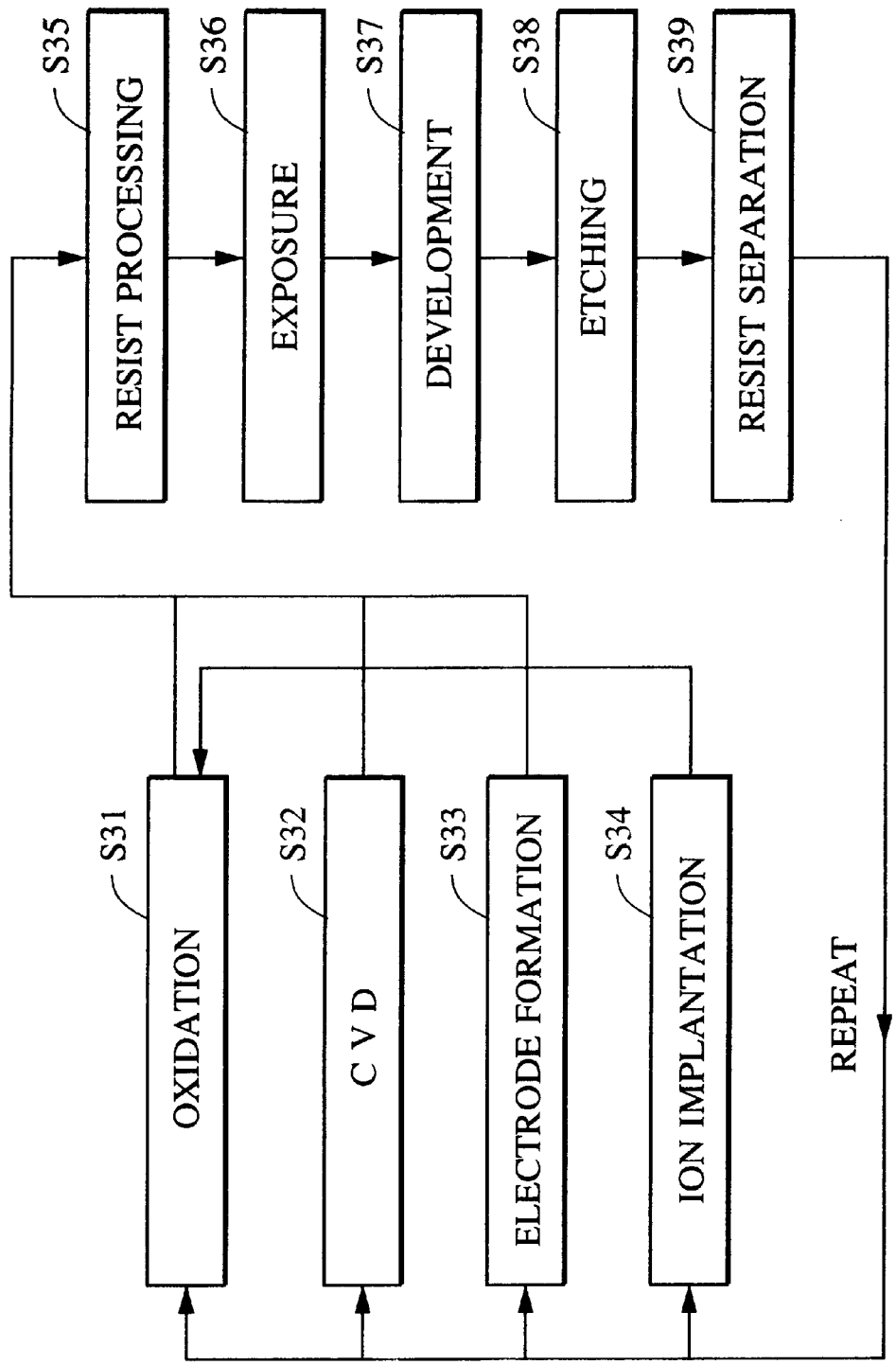
FIG. 24 is a diagram showing a flowchart for a wafer process.
Figure 25:
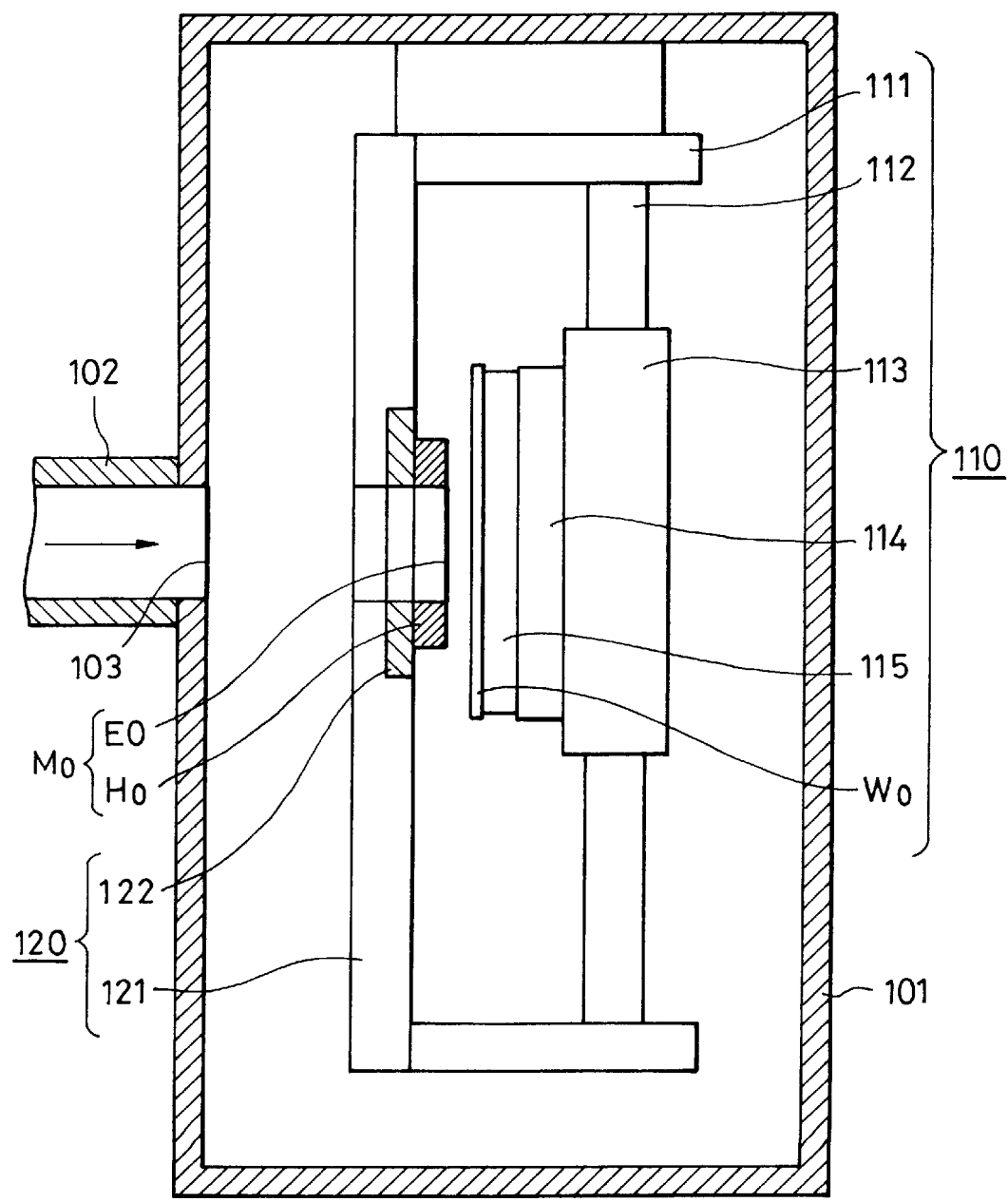
FIG. 25 is a diagram showing a conventional example.

FIG. 24 is a detailed flowchart of the wafer process mentioned above. In step 11 (oxidation), the surface of a wafer is oxidized. In step 12 (CVD), an insulating layer is formed on the surface of the wafer. In step 13 (electrode formation), electrodes are formed on the wafer by evaporation. In step 14 (ion implantation), ions are implanted in the wafer. In step 15 (resist processing), a photosensitive material is applied to the wafer. In step 16 (exposure), the circuit pattern of the mask is exposed and printed on the wafer by the above-described exposure device. In step 17 (development), the exposed wafer is developed. In step 18 (etching), the portion other than the developed resist image is cut off. In step 19 (resist separation), the resist which has become unnecessary after etching is removed. By repeating these steps, a multi-circuit pattern is formed on the wafer. By using the production method of this embodiment, it is possible to produce high-integration semiconductor devices, which have conventionally been difficult to produce, at low cost.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure method comprising the steps of:

providing a wafer and a mask, having a membrane and a pattern formed thereon;

relatively moving and arranging the mask and the wafer opposite to each other with a minute gap between them;

obtaining information corresponding to deformation of the membrane of the mask, due to the relative movement, in a direction of the gap between the mask and the wafer, after the mask and the wafer are arranged opposite to each other with the minute gap between them;

adjusting the positional relationship of the mask and the wafer on the basis of the obtained information, to reduce the influence of the deformation of the membrane; and transferring the pattern of the mask onto the wafer by exposing the mask to radiant energy.

2. An exposure method according to claim 1, wherein said information obtaining step comprises detecting deformation in a direction perpendicular to the surface of the membrane at a plurality of positions on the membrane surface.

3. An exposure method according to claim 1, wherein said information obtaining step comprises detecting the gap between the mask and the wafer.

4. An exposure method according to claim 1, wherein said reducing step comprises adjusting a positional relationship between the mask and the wafer.

5. An exposure method according to claim 4, wherein said reducing step comprises adjusting one of the positional relationship in the opposed direction between the mask and the wafer and in an in-plane direction of the mask and the wafer.

6. An exposure method according to claim 4, wherein said adjusting step comprises adjusting a speed of relative movement between the mask and the wafer.

7. An exposure method according to claim 1, wherein said transferring step comprises sequentially transferring the pattern of the mask onto a plurality of regions of the wafer.

8. An exposure method according to claim 1, wherein said transferring step comprises effecting the exposure with X-rays.

9. A semiconductor device producing method comprising the steps of:
providing a wafer and a mask, having a membrane and a pattern formed thereon;
relatively moving and arranging the mask and the wafer opposite to each other with a minute gap therebetween;
obtaining information corresponding to deformation of the membrane and the mask, due to the relative movement, in a direction of the gap between the mask and the wafer, after the mask and the wafer are arranged opposite to each other with the minute gap between them;
adjusting the positional relationship of the mask and the wafer on the basis of the obtained information, to reduce the influence of the deformation of the membrane; and
transferring the pattern of the mask onto the wafer by exposing the mask to radiant energy in order to produce semiconductor devices.

10. A method according to claim 9, wherein said information obtaining step comprises detecting deformation in a direction perpendicular to the surface of the membrane at a plurality of positions on the membrane surface.

11. A method according to claim 9, wherein said information obtaining step comprises detecting the gap between the mask and the wafer.

12. A method according to claim 9, wherein said reducing step comprises adjusting a positional relationship between the mask and the wafer.

13. A method according to claim 12, wherein said reducing step comprises adjusting one of the positional relationship in the opposed direction between the mask and the wafer and in an in-plane direction of the mask and the wafer.

14. A method according to claim 12, wherein said adjusting step comprises adjusting a speed of relative movement between the mask and the wafer.

15. A method according to claim 9, wherein said transferring step comprises sequentially transferring the pattern of the mask onto a plurality of regions of the wafer.

16. A method according to claim 9, wherein said transferring step comprises effecting the exposure with X-rays.

17. An exposure device comprising:
a mask stage for holding a mask having a membrane and a pattern formed thereon;
a wafer stage for holding a wafer;
moving means for relatively moving said mask stage and said wafer stage to arrange the mask and the wafer opposite to each other with a minute gap between them;
means for obtaining, after said moving means arranges the mask and the wafer opposite to each other with the minute gap between them, information corresponding to deformation of the membrane of the mask, due to the relative movement, in a direction of the gap between the mask and the wafer;
means for adjusting the positional relationship of the mask and the wafer on the basis of the obtained information, to reduce the influence of the deformation of the membrane; and
exposure means for transferring the pattern of the mask onto the wafer by exposing the mask to radiant energy.

18. An exposure device according to claim 17, wherein said means for obtaining information comprises an alignment scope.

19. An exposure device according to claim 17, wherein said exposure means comprises means for exposing the mask to X-rays.

20. An exposure device according to claim 17, wherein said means for obtaining information comprises detecting means for detecting deformation in a direction perpendicular to the surface of the membrane at a plurality of positions on the membrane surface.

21. An exposure device according to claim 17, wherein said means for obtaining information comprises means for detecting the gap between the mask and the wafer.

22. An exposure device according to claim 17, wherein said adjusting means adjusts a positional relationship between the mask and the wafer.

23. An exposure device according to claim 22, wherein said adjusting means adjusts one of the positional relationship in the opposed direction between the mask and the wafer and in an in-plane direction of the mask and the wafer.

24. An exposure device according to claim 22, wherein said adjusting means adjusts a speed of relative movement between the mask and the wafer.

25. An exposure device according to claim 17, wherein said exposure means sequentially transfers the pattern of the mask onto a plurality of regions of the wafer.

26. An exposure method comprising the steps of:
providing a wafer and a mask, having a membrane and a pattern formed thereon;
relatively moving and arranging the mask and the wafer opposite to each other with a minute gap between them;
obtaining information corresponding to deformation of the membrane of the mask, in a direction of the gap between the mask and the wafer;

adjusting speed of the relative movement between the mask and the wafer in the direction of the gap, on the basis of the obtained information, to reduce the influence of the deformation of the membrane; and transferring the pattern of the mask onto the wafer by exposing the mask to radiant energy.

27. An exposure method according to claim 26, wherein said information obtaining step comprises detecting deformation in a direction perpendicular to the surface of the membrane at a plurality of positions on the membrane surface.

28. An exposure method according to claim 26, wherein said information obtaining step comprises detecting the gap between the mask and the wafer.

29. An exposure method according to claim 26, wherein said reducing step comprises adjusting a positional relationship between the mask and the wafer.

30. An exposure according to claim 29, wherein said reducing step comprises adjusting one of the positional relationship in the opposed direction between the mask and the wafer and in an in-plane direction of the mask and the wafer.

31. An exposure method according to claim 26, wherein said transferring step comprises sequentially transferring the pattern of the mask onto a plurality of regions of the wafer.

32. An exposure method according to claim 26, wherein said transferring step comprises effecting the exposure with X-rays.

33. An exposure method comprising the steps of:

providing a wafer and a mask, having a membrane and a pattern formed thereon;

relatively moving and arranging the mask and the wafer opposite to each other with a minute gap between them;

obtaining information corresponding to changes of the gap between the mask and the wafer;

adjusting the gap between the mask and the wafer while effecting relative movement between the mask and the wafer in a direction substantially parallel to the surface of the membrane, on the basis of the obtained information, to reduce the influence of changes in the gap; and transferring the pattern of the mask onto the wafer by exposing the mask to radiant energy.

34. An exposure method according to claim 33, wherein said information obtaining step comprises detecting deformation in a direction perpendicular to the surface of the membrane at a plurality of positions on the membrane surface.

35. An exposure method according to claim 33, wherein said information obtaining step comprises detecting the gap between the mask and the wafer.

36. An exposure method according to claim 33, wherein said reducing step comprises adjusting a positional relationship between the mask and the wafer.

37. An exposure according to claim 36, wherein said reducing step comprises adjusting one of the positional relationship in the opposed direction between the mask and the wafer and in an in-plane direction of the mask and the wafer.

38. An exposure method according to claim 36, wherein said adjusting step comprises adjusting a speed of relative movement between the mask and the wafer.

39. An exposure method according to claim 33, wherein said transferring step comprises sequentially transferring the pattern of the mask onto a plurality of regions of the wafer.

40. An exposure method according to claim 33, wherein said transferring step comprises effecting the exposure with X-rays.

41. A semiconductor device producing method comprising the steps of:

providing a wafer and a mask having a membrane and a pattern formed thereon;

relatively moving and arranging the mask and the wafer opposite to each other with a minute gap between them;

obtaining information corresponding to deformation of the membrane of the mask, in a direction of the gap between the mask and the wafer;

adjusting speed of the relative movement between the mask and the wafer in the direction of the gap, on the basis of the obtained information, to reduce the influence of the deformation of the membrane; and transferring the pattern of the mask onto the wafer by exposing the mask to radiant energy in order to produce semiconductor devices.

42. A method according to claim 41, wherein said information obtaining step comprises detecting deformation in a direction perpendicular to the surface of the membrane at a plurality of positions on the membrane surface.

43. A method according to claim 41, wherein said information obtaining step comprises detecting the gap between the mask and the wafer.

44. A method according to claim 41, wherein said reducing step comprises adjusting a positional relationship between the mask and the wafer.

45. A method according to claim 44, wherein said reducing step comprises adjusting one of the positional relationship in the opposed direction between the mask and the wafer and in an in-plane direction of the mask and the wafer.

46. A method according to claim 44, wherein said adjusting step comprises adjusting a speed of relative movement between the mask and the wafer.

47. A method according to claim 41, wherein said transferring step comprises sequentially transferring the pattern of the mask onto a plurality of regions of the wafer.

48. A method according to claim 41, wherein said transferring step comprises effecting the exposure with X-rays.

49. A semiconductor device producing method comprising the steps of:

providing a wafer and a mask, having a membrane and a pattern formed thereon;

relatively moving and arranging the mask and the wafer opposite to each other with a minute gap between them;

obtaining information corresponding to changes of the gap between the mask and the wafer;

adjusting the gap between the mask and the wafer while effecting relative movement between the mask and the wafer in a direction substantially parallel to the surface of the membrane, on the basis of the obtained information, to reduce the influence of changes in the gap; and transferring the pattern of the mask onto the wafer by exposing the mask to radiant energy in order to produce semiconductor devices.

50. A method according to claim 49, wherein said information obtaining step comprises detecting deformation in a direction perpendicular to the surface of the membrane at a plurality of positions on the membrane surface.

51. A method according to claim 49, wherein said information obtaining step comprises detecting the gap between the mask and the wafer.

52. A method according to claim 49, wherein said reducing step comprises adjusting a positional relationship between the mask and the wafer.

53. A method according to claim 52, wherein said reducing step comprises adjusting one of the positional relationship in the opposed direction between the mask and the wafer and in an in-plane direction of the mask and the wafer.

54. A method according to claim 52, wherein said adjusting step comprises adjusting a speed of relative movement between the mask and the wafer.

55. A method according to claim 49, wherein said transferring step comprises sequentially transferring the pattern of the mask onto a plurality of regions of the wafer.

56. A method according to claim 49, wherein said transferring step comprises effecting the exposure with X-rays.

57. An exposure device comprising:

a mask stage for holding a mask having a membrane and a pattern formed thereon;

a wafer stage for holding a wafer;

moving means for relatively moving said mask stage and said wafer stage to arrange the mask and the wafer opposite to each other with a minute gap between them;

means for obtaining information corresponding to deformation of the membrane of the mask, due to the relative movement, in a direction of the gap between the mask and the wafer;

means for adjusting a speed of the relative movement between the mask and the wafer in the direction of the gap, on the basis of the obtained information, to reduce the influence of the deformation of the membrane; and exposure means for transferring the pattern of the mask onto the wafer by exposing the mask to radiant energy.

58. An exposure device according to claim 57, wherein said means for obtaining information comprises an alignment scope.

59. An exposure device according to claim 57, wherein said exposure means comprises means for exposing the mask to X-rays.

60. An exposure device according to claim 57, wherein said means for obtaining information comprises detecting means for detecting deformation in a direction perpendicular to the surface of the membrane at a plurality of positions on the membrane surface.

61. An exposure device according to claim 57, wherein said means for obtaining information comprises means for detecting the gap between the mask and the wafer.

62. An exposure device according to claim 57, wherein said adjusting means adjusts a positional relationship between the mask and the wafer.

63. An exposure device according to claim 62, wherein said adjusting means adjusts one of the positional relationship in the opposed direction between the mask and the wafer and in an in-plane direction of the mask and the wafer.

64. An exposure device according to claim 62, wherein said adjusting means adjusts a speed of relative movement between the mask and the wafer.

65. An exposure device according to claim 57, wherein said exposure means sequentially transfers the pattern of the mask onto a plurality of regions of the wafer.

66. An exposure device comprising:

a mask stage for holding a mask having a membrane and a pattern formed thereon;

a wafer stage for holding a wafer;

moving means for relatively moving said mask stage and said wafer stage to arrange the mask and the wafer opposite to each other with a minute gap between them;

means for obtaining information corresponding to deformation of the membrane of the mask, due to the relative movement, in a direction of the gap between the mask and the wafer;

means for adjusting the positional relationship of the mask and the water on the basis of the obtained information, to reduce the influence of the deformation of the membrane; and exposure means for transferring the pattern of the mask onto the wafer by exposing the mask to radiant energy.

67. An exposure device according to claim 66, wherein said means for obtaining information comprises an alignment scope.

68. An exposure device according to claim 66, wherein said exposure means comprises means for exposing the mask to X-rays.

69. An exposure device according to claim 66, wherein said means for obtaining information comprises detecting means for detecting deformation in a direction perpendicular to the surface of the membrane at a plurality of positions on the membrane surface.

70. An exposure device according to claim 66, wherein said means for obtaining information comprises means for detecting the gap between the mask and the wafer.

71. An exposure device according to claim 66, wherein said adjusting means adjusts a positional relationship between the mask and the wafer.

72. An exposure device according to claim 71, wherein said adjusting means adjusts one of the positional relationship in the opposed direction between the mask and the wafer and in an in-plane direction of the mask and the wafer.

73. An exposure device according to claim 71, wherein said adjusting means adjusts a speed of relative movement between the mask and the wafer.

74. An exposure device according to claim 66, wherein said exposure means sequentially transfers the pattern of the mask onto a plurality of regions of the wafer.

75. An exposure method comprising the steps of:

providing a wafer and a mask, having a membrane and a pattern formed thereon;

relatively moving and arranging the mask and the wafer opposite to each other with a minute gap between them;

obtaining information corresponding to deformation of the membrane of the mask, due to the relative movement, in a direction of the gap between the mask and the wafer, after the mask and the wafer are arranged opposite to each other with the minute gap between them;

adjusting the positional relationship of the mask and the wafer on the basis of the obtained information, to reduce the influence of the deformation of the membrane, said adjusting step comprising adjusting (i) a speed of relative movement between the mask and the wafer, and (ii) a positional relationship between the mask and the wafer; and transferring the pattern of the mask onto the wafer by exposing the mask to radiant energy.

76. A semiconductor device producing method comprising the steps of:

providing a wafer and a mask, having a membrane and a pattern formed thereon;

relatively moving and arranging the mask and the wafer opposite to each other with a minute gap therebetween;

obtaining information corresponding to deformation of the membrane and the mask, due to the relative movement, in a direction of the gap between the mask and the wafer;

adjusting the positional relationship of the mask and the wafer on the basis of the obtained information, to reduce the influence of the deformation of the membrane, said adjusting step comprising adjusting (i) a speed of relative movement between the mask and the wafer, and (ii) a positional relationship between the mask and the wafer; and transferring the pattern of the mask onto the wafer by exposing the mask to radiant energy in order to produce semiconductor devices.

77. An exposure device comprising:

a mask stage for holding a mask having a membrane and a pattern formed thereon;

a wafer stage for holding a wafer;

moving means for relatively moving said mask stage and said wafer stage to arrange the mask and the wafer opposite to each other with a minute gap between them;

means for obtaining information corresponding to deformation of the membrane of the mask, due to the relative movement, in a direction of the gap between the mask and the wafer;

adjusting means for adjusting the positional relationship of the mask and the wafer on the basis of the obtained information, to reduce the influence of the deformation of the membrane, wherein said adjusting means adjusts (i) a positional relationship between the mask and the wafer, and (ii) a speed of relative movement between the mask and the wafer; and exposure means for transferring the pattern of the mask onto the wafer by exposing the mask to radiant energy.

78. An exposure method comprising the steps of:

providing a wafer;

providing a mask having a membrane and a pattern formed thereon;

arranging the mask and the wafer opposite to each other with a minute gap between them;

obtaining information corresponding to changes of the gap between the mask and the wafer;

adjusting the gap between the mask and the wafer while effecting relative movement between the mask and the wafer in a direction substantially parallel to the surface of the membrane, on the basis of the obtained information, to reduce the influence of changes in the gap; and transferring the pattern of the mask onto the waver by exposing the mask to radiant energy.

79. A semiconductor device producing method comprising the steps of:

providing a wafer;

providing a mask having a membrane and a pattern formed thereon;

arranging the mask and the wafer opposite to each other with a minute gap between them;

obtaining information corresponding to changes of the gap between the mask and the wafer;

adjusting the gap between the mask and the wafer while effecting relative movement between the mask and the wafer in a direction substantially parallel to the surface of the membrane, on the basis of the obtained information, to reduce the influence of changes in the gap; and transferring the pattern of the mask onto the wafer by exposing the mask to radiant energy in order to produce semiconductor devices.

80. An exposure device comprising:

a mask stage for holding a mask having a membrane and a pattern formed thereon;

a wafer stage for holding a wafer;

moving means for relatively moving said mask stage and said wafer stage to arrange the mask and the wafer opposite to each other with a minute gap between them;

means for obtaining information corresponding to changes of the gap between the mask and wafer;

means for adjusting the gap between the mask wafer while effecting relative movement between the mask and the wafer in a direction substantially parallel to the surface of the membrane, on the basis of the obtained information, to reduce the influence of changes in the gap; and transferring the pattern of the mask onto the wafer by exposing the mask to radiant energy.

81. An exposure device according to claim 80, wherein said means for obtaining information comprises an alignment scope.

82. An exposure device according to claim 80, wherein said exposure means comprises means for exposing the mask to X-rays.

83. An exposure device according to claim 80, wherein said means for obtaining information comprises detecting means for detecting deformation in a direction perpendicular to the surface of the membrane at a plurality of positions on the membrane surface.

84. An exposure device according to claim 80, wherein said means for obtaining information comprises means for detecting the gap between the mask and the wafer.

85. An exposure device according to claim 80, wherein said adjusting means adjusts a positional relationship between the mask and the wafer.

86. An exposure device according to claim 85, wherein said adjusting means adjusts one of the positional relationship in the opposed direction between the mask and the wafer and in an in-plane direction of the mask and the wafer.

87. An exposure device according to claim 85, wherein said adjusting means adjusts a speed of relative movement between the mask and the wafer.

88. An exposure device according to claim 80, wherein said exposure means sequentially transfers the pattern of the mask onto a plurality of regions of the wafer.

* * * * *

UNITED STATES PATENT AND TRADEMARK OFFICE
CERTIFICATE OF CORRECTION

PATENT NO. : 6,144,719
DATED : November 7, 2000
INVENTORS : Takayuki HASEGAWA et al.

It is certified that error appears in the above-identified patent and that said Letters Patent is hereby corrected as shown below:

COLUMN 4:

Line 35, "Hi" should read --H1--.
Line 37, "Hi" should read --H1--.

COLUMN 6:

Line 53, "Dt=|ΔZ-ΔG|" should read --Dt=|ΔZ-ΔG|.--.

COLUMN 25:

Line 47, "waver" should read --wafer--.

Signed and Sealed this

First Day of May, 2001

Attest:

NICHOLAS P. GODICI

Attesting Officer      Acting Director of the United States Patent and Trademark Office